United States Patent [19]
Hirai et al.

[11] Patent Number: 5,838,048
[45] Date of Patent: Nov. 17, 1998

[54] SEMICONDUCTOR BI-MIS DEVICE

[75] Inventors: Takehiro Hirai, Osaka; Masahiro Nakatani, Ishikawa; Mitsuo Tanaka; Akihiro Kanda, both of Osaka, all of Japan

[73] Assignee: Matsushita Electric Industrial Co., Ltd., Osaka, Japan

[21] Appl. No.: 915,327

[22] Filed: Aug. 20, 1997

Related U.S. Application Data

[60] Division of Ser. No. 691,341, Aug. 2, 1996, Pat. No. 5,696,006, which is a continuation-in-part of Ser. No. 505,639, Jul. 21, 1995, abandoned, which is a continuation of Ser. No. 311,327, Sep. 23, 1994, abandoned, which is a continuation of Ser. No. 76,838, Jun. 15, 1993, Pat. No. 5,406,106.

[30] Foreign Application Priority Data

Jun. 24, 1992 [JP] Japan ................................ 4-165845

[51] Int. Cl.[6] ........................... H01L 27/02; H01L 29/68
[52] U.S. Cl. ...................... 257/378; 257/316; 257/324; 257/370; 257/555; 257/627
[58] Field of Search ..................................... 257/316, 324, 257/370, 441, 378, 555, 627

[56] References Cited

U.S. PATENT DOCUMENTS

| | | | |
|---|---|---|---|
| 4,247,861 | 1/1981 | Hsu et al. | 257/378 |
| 4,484,388 | 11/1984 | Iwasaki | 29/571 |
| 5,005,066 | 4/1991 | Chen | 257/378 |

FOREIGN PATENT DOCUMENTS 64-59952  3/1989  Japan .

*Primary Examiner*—Valencia Wallace
*Attorney, Agent, or Firm*—McDermott, Will & Emery

[57] ABSTRACT

A silicon oxide film and a polysilicon film are formed on a silicon substrate and are selectively etched to form a contact hole in a region where an emitter is to be formed. A polysilicon film is laid on the substrate and two polysilicon films are patterned to form an emitter electrode and a gate electrode made of the two polysilicon films which are doped with arsenic. The arsenic is diffused from the polysilicon films of the emitter electrode into the silicon substrate to form an $N^+$ emitter layer which has a high concentration and is shallow. Consequently, the contamination of a gate insulator film can be prevented from occurring and a bipolar transistor having high performance, for example, a high current amplification factor or the like can be formed.

8 Claims, 33 Drawing Sheets

SEMICONDUCTOR BI-MIS DEVICE

This is a divisional of application Ser. No. 08/691,341, filed Aug. 2, 1996, now U.S. Pat. No. 5,696,006 which is a continuation-in-part of Ser. No. 08/505,639, filed Jul. 21, 1995, now abandoned, which was a file wrapper continuation of Ser. No. 08/311,327, filed Sep. 23, 1994, now abandoned, which was a continuing application of Ser. No. 08/076,838, filed Jun. 15, 1993, now U.S. Pat. No. 5,406,106.

BACKGROUND OF THE INVENTION

This invention relates to a composite semiconductor device in which a bipolar transistor and a MIS transistor are formed on a semiconductor substrate and to a method of manufacturing the semiconductor.

There has been many semiconductor devices with Bi-CMOS structure proposed in which a bipolar transistor and a complementary MOS transistor (CMOS transistor) are integrally formed.

As a method of manufacturing a general semiconductor with Bi-CMOS structure, a method disclosed in Japanese Patent Application Laying Open Gazette No.64-59952 is explained, with reference to FIGS. 31–33.

As shown in FIG. 31, an $N^+$ buried layer 3 and a $P^+$ buried layer 4 are formed on a P-type silicon substrate 1 and an $N^-$ type epitaxial layer 6 are formed thereon. After a P-well 6a is provided on the $N^-$ type epitaxial layer 6, a field insulator film 17f is formed on a part of the surface of the substrate according to a selective oxidization process so as to define a region Rbip where a bipolar transistor is to be formed, a region Rnmos where an NMOS transistor is to be formed, and a region Rpmos where a PMOS transistor is to be formed. A silicon oxide film 17 as a dielectric film is formed and a $P^-$ type active base region 11 of an NPN bipolar transistor is formed.

Then, as shown in FIG. 32, the silicon surface is exposed by etching the silicon oxide film 17 on the $P^-$ type active base region 11, using a resist as a mask or the like so as to make an emitter contact hole 19a. A polysilicon film 21 of 300 nm thickness is laid on the substrate according to a low pressure CVD method.

Next, as shown in FIG. 33, the polysilicon film 21 is etched using the resist as a mask to form an emitter polysilicon electrode 21a in the region Rbip where the bipolar transistor is to be formed, and to concurrently form gate polysilicon electrodes 21f in the region Rnmos where the NMOS transistor is to be formed and the region Rpmos where the PMOS transistor is to be formed. Then, implant and diffusion of arsenic ions are selectively conducted over the substrate to form an $N^+$ emitter layer 23 of the NPN bipolar transistor and a source 14a and a drain 14b of an NMOSFET. At this time, the arsenic is also doped to a gate polysilicon electrode 21f of the NMOSFET. Further, implant and diffusion of boron ions are conducted to form a grafting base region 11a of the NPN bipolar transistor and a source 15a and a drain 15b of the PMOSFET. At this time, the boron is also doped to the gate polysilicon electrode 21f of the PMOSFET.

Thus manufactured is the semiconductor device with Bi-MOS structure.

The above semiconductor device and the method thereof, however, have following problems.

(1) The silicon oxide film 17 is contaminated by resist coating, etching, and the like, since the step of forming the contact holes such as the emitter diffusion hole 19a of the bipolar transistor is carried out after the step of forming the silicon oxide film 17 and before the step of laying the polysilicon film 21.

(2) It is required to conduct dip-etching for removing a natural oxide film on the $N^+$ emitter layer 23 after the step of forming the emitter contact hole 19a and before the step of laying the polysilicon film 21. However, in conventional semiconductor device and method thereof, in case with the silicon oxide film 17 of about 10 nm thickness, such dip-etching reduces the thickness of the silicon oxide film 17 further, so that variation of the characteristic and deficiency due to pin holes are caused. This involves a problem in a MOSFET. In the bipolar transistor, since the silicon oxide film 17 is used as an insulator film between a subsurface silicon substrate and the polysilicon film 21 which serves as an emitter diffusion mask and an emitter electrode, deficiency in durability to high voltage between the emitter and the base and increase in leakage current are caused.

On the other hand, Japanese Patent Application Laying Open Gazette No.3-148862 discloses a method in order to enhance the performance of a bipolar transistor, which is required accompanied by miniaturization of elements. The method is that: a silicon oxide film is formed as a gate insulator film on an entire substrate before the contact hole of the bipolar transistor is made; after a polysilicon film to be a part of a gate electrode is laid on the silicon oxide film and the polysilicon film on an active region of the bipolar transistor is removed by etching, a thick silicon oxide film is further laid thereon; the contact hole of the bipolar transistor is made at the same time as the silicon oxide film of the MOS transistor is removed; and a polysilicon film to be a part of the electrode of the bipolar transistor and the gate electrode of the MOS transistor is laid thereon. In this method, since the silicon oxide film of the gate electrode of the MOS transistor is covered with the polysilicon film at the formation of contact hole of the bipolar transistor, the contamination to the silicon oxide film can be lessened. However, the step of removing the polysilicon at the active region of the bipolar transistor is required beside the step of forming the contact hole of the bipolar transistor, which means increase in manufacturing steps. Therefore, the cost increases though the contamination to the gate insulator film is prevented.

The bipolar transistor has the following problems in respect of performance.

In particular, the performance such as a current amplification factor hFE of the bipolar transistor or the like is enhanced more if an emitter diffusion layer has a higher concentration and is shallower. In the manufacturing method according to the prior art, it is hard to form an emitter contact layer which has a high impurity concentration and is shallow by a simple process. Under the circumstances, these requirements are met by taking plenty of time.

SUMMARY OF THE INVENTION

In consideration of the foregoing, it is an object of the present invention to provide the structure of a semiconductor device in which a MIS transistor and a bipolar transistor are provided on a common semiconductor substrate and a method of manufacturing the semiconductor device, wherein the contamination of a gate insulator film of the MIS transistor can be prevented without an increase in the manufacturing steps, and a BiCMOS device in which the MIS transistor and the bipolar transistor have high performance can be obtained.

The present invention provides the basic structure of a semiconductor device in which a MIS transistor and a bipolar transistor are arranged on a semiconductor substrate, comprising the MIS transistor having a gate insulator film formed on the semiconductor substrate, a gate electrode formed on the gate insulator film and made of first and second conductor films which are doped with a first conductivity type impurity, and a source-drain diffusion layer formed in regions located at both sides of the gate electrode in the semiconductor substrate and into which the first conductivity type impurity is doped, and the bipolar transistor having an emitter diffusion layer, a base diffusion layer and a collector diffusion layer which are formed in the semiconductor substrate, an insulator film formed in a region of the semiconductor substrate where an emitter is to be formed, and made of the same material as that of the gate insulator film of the MIS transistor, and an emitter electrode formed on the insulator film and made of the same material as those of the first and second conductor films of the MIS transistor, wherein the second conductor film of the emitter electrode buries a contact hole formed on the insulator film and the first conductor film to come in contact with the emitter diffusion layer, and the emitter diffusion layer is doped with the first conductivity type impurity diffused from the first and second conductor films forming the emitter electrode.

According to the above-mentioned structure, the gate insulator film of the MIS transistor is made of a film common to the insulator film on the emitter of the bipolar transistor, and the emitter electrode of the bipolar transistor and the gate electrode of the MIS transistor are made of the common first and second conductor films. Consequently, the gate insulator film of the MIS transistor is not exposed after the first conductor film is laid. Accordingly, the gate insulator film of the MIS transistor is not contaminated during a manufacturing process. Thus, the MIS transistor keeps high reliability and excellent characteristics. In addition, the emitter diffusion layer of the bipolar transistor is in contact with the emitter electrode thereof, and the emitter diffusion layer is doped with the impurity diffused from the two conductor films of the emitter electrode. Consequently, the concentration of the impurity in the emitter diffusion layer can be extremely increased. Furthermore, since the emitter diffusion layer has a smaller depth than that of the emitter diffusion layer formed by ion implantation. Thus, the characteristics of the bipolar transistor, for example, a current amplification factor and the like can be enhanced.

In the basic structure of the semiconductor device, the depth of the emitter diffusion layer of the bipolar transistor can be smaller than that of the source-drain diffusion layer of the MIS transistor.

According to such structure, the performance of the bipolar transistor can be enhanced surely. In addition, the depth of the source-drain diffusion layer of the MIS transistor is fully great. Consequently, a steep concentration profile can be avoided, and the degradation of hot carrier resistance of the MIS transistor and the like can be prevented effectively.

In the basic structure of the semiconductor device, it is preferable that the emitter diffusion layer of the bipolar transistor should have a depth of 0.2 µm or less and a maximum impurity concentration of $8 \times 10^{19}$ cm$^{-3}$ or more, and that the source-drain diffusion layer of the MIS transistor should have a depth of 0.3 µm or less and a maximum impurity concentration of $1 \times 10^{20}$ cm$^{-3}$ or more.

In the basic structure of the semiconductor device, a first side well made of an insulator material can be provided on the outer side of the emitter electrode of the bipolar transistor, and a second side wall made of the same material as that of the first side wall can be provided on the side of the gate electrode of the MIS transistor.

According to such structure, the MIS transistor can have LDD structure advantageous to the miniaturization depending on the arrangement place and kind thereof. Thus, the performance of the MIS transistor can be enhanced.

In the basic structure of the semiconductor device, a third side wall made of an insulator material can be provided on the side of the contact hole of the emitter electrode of the bipolar transistor.

According to such structure, the contact area of the emitter diffusion layer of the bipolar transistor with the emitter electrode thereof is reduced so that an emitter width becomes much smaller than an emitter width defined by photolithography. Accordingly, the parasitic capacity between an emitter and a base can be reduced. Consequently, the performance of the bipolar transistor can be enhanced more.

In this case, a base contact layer formed in self-alignment with the first side wall can be provided in the base diffusion layer of the bipolar transistor.

With such structure, the semiconductor device having minuter structure can be obtained.

In the basic structure of the semiconductor device, an interelectrode insulator film can be formed between the first and second conductor films of the gate electrode of the MIS transistor and the emitter electrode of the bipolar transistor, the MIS transistor can serve as a non-volatile memory cell transistor, the first conductor film can serve as a floating gate of the non-volatile memory cell, and the second conductor film can serve as a control gate of the non-volatile memory cell.

According to such structure, the MIS transistor is changed to a FAMOS transistor. It is possible to obtain the semiconductor device in which the FAMOS transistor having excellent characteristics of the gate insulator film and the bipolar transistor having excellent characteristics such as a high current amplification factor and the like are provided.

In the basic structure of the semiconductor device, the bipolar transistor can be an NPN type bipolar transistor, and the MIS transistor can be an N-channel type MIS transistor.

According to such structure, the NPN type bipolar transistor which influences the characteristics of the whole semiconductor device and the N-channel type MOS transistor have the above-mentioned effects. Consequently, the performance of the semiconductor device can be enhanced surely.

The present invention provides a basic method of manufacturing a semiconductor device in which a MIS transistor and a bipolar transistor are arranged on a common semiconductor substrate, comprising the steps of forming a first dielectric film to be a gate insulator film of the MIS transistor and an insulator film on an emitter of the bipolar transistor in at least regions of the semiconductor substrate where the MIS transistor and the bipolar transistor are to be formed, forming a first conductor film containing a first conductivity type impurity on the first dielectric film, forming a contact hole by selectively etching the first dielectric film and the first conductor film to open an upper part of a region where the emitter diffusion layer of the bipolar transistor is to be formed, forming a second conductor film for covering the first conductor film and the exposed face of the contact hole, forming a gate electrode of the MIS transistor and an emitter electrode of the bipolar transistor made of the first and second conductor films which contain the first conductivity type impurity by patterning the first and second conductor films and doping the second conductor film with the first conductivity type impurity, and forming an emitter diffusion layer of the bipolar transistor by performing heat treatment to diffuse the first conductivity type impurity in the emitter electrode of the bipolar transistor into the semiconductor substrate.

According to such a method, a portion of the first conductor film which serves as the gate insulator film of the MIS transistor at the step of forming the first conductor film is not removed at the following steps but remains as a part of the gate electrode. Consequently, the contamination of the gate insulator film can be surely prevented with a decrease in the number of steps. In addition, the impurity is diffused from two conductor films into the emitter diffusion layer of the bipolar transistor through two paths at the step of forming the emitter diffusion layer of the bipolar transistor. Consequently, the emitter diffusion layer which has a high impurity concentration and is shallow can be formed. Accordingly, it is possible to manufacture the semiconductor device in which the bipolar transistor having very high performance such as a high current amplification factor and the MIS transistor having no contamination of the gate insulator film and excellent characteristics are provided at the smaller number of steps.

In the basic method of manufacturing a semiconductor device, the step of forming the first conductor film can be carried out so as to lay the first conductor film and then perform doping with the first conductivity type impurity by ion implantation.

In the basic method of manufacturing a semiconductor device, the step of forming a gate electrode of the MIS transistor and an emitter electrode of the bipolar transistor may be carried out in such a manner that the first and second conductor films are patterned to form the gate electrode and the emitter electrode, that a mask member is formed in which an upper part of the emitter electrode other than both ends of the emitter electrode is open in the region where the bipolar transistor is to be formed and an upper portion of at least a part of the gate electrode and an upper portion of at least a part of the region where a source-drain diffusion layer is to be formed are open in the region where the MIS transistor is to be formed, and that first conductivity type impurity ions are implanted from the upper portion of the mask member.

In that case, the following embodiments can be employed.

The method of manufacturing a semiconductor device can further comprise the step of forming a source and a drain of the MIS transistor, wherein the step of forming a gate electrode of the MIS transistor and an emitter electrode of the bipolar transistor is carried out so as to form a source-drain contact layer as a source-drain diffusion layer of the MIS transistor.

The step of forming a gate electrode of the MIS transistor and an emitter electrode of the bipolar transistor can be carried out so as to form a source-drain as a source-drain diffusion layer of the MIS transistor.

The step of forming a gate electrode of the MIS transistor and an emitter electrode of the bipolar transistor can be carried out in such a manner that the opening of the mask member in the region where the MIS transistor is to be formed is consecutively formed over the upper part of the region where the source-drain diffusion layer is to be formed at both sides of the gate electrode from the upper part of the gate electrode, and that the source-drain diffusion layer is formed in self-alignment with the gate electrode.

According to the above-mentioned method, it is possible to form a minuter MIS transistor.

The basic method of manufacturing a semiconductor device can further comprise the step of forming first and second side walls on the sides of the emitter electrode and the gate electrode by laying a second dielectric film over the whole face of a substrate and then performing anisotropic etching for the second dielectric film after the emitter electrode and the gate electrode are formed and before the first conductivity type impurity ions are implanted.

According to such a method, it is possible to form a MIS transistor having LDD structure.

The basic method of manufacturing a semiconductor device can further comprise the step of forming a third side wall on the side of the contact hole by laying a third dielectric film over the whole face of a substrate and then performing anisotropic etching for the third dielectric film after the step of forming a contact hole and before the step of forming a second conductor film.

According to such a method, the emitter width is made much smaller than the emitter width defined by photolithography. Consequently, a bipolar transistor having higher performance can be formed.

The basic method of manufacturing a semiconductor device can further comprise the step of forming a fourth dielectric film on the first conductor film after the step of forming a first conductor film and before the step of forming a second conductor film, wherein the step of forming a second conductor film is carried out so as to lay the first conductor film on the fourth dielectric film, and the step of forming a gate electrode of the MIS transistor and an emitter electrode of the bipolar transistor is carried out so as to pattern the fourth dielectric film together with the first and second conductor films and to form a floating gate and a control gate of a non-volatile memory cell as the gate electrode of the MIS transistor.

According to such a method, it is possible to manufacture a semiconductor device in which the bipolar transistor having high performance and the FAMOS transistor having no contamination of the gate insulator film are provided at the smaller number of steps.

In the basic method of manufacturing a semiconductor device, it is preferable that the step of forming a first conductor film should be carried out so as to dope the first conductor film with the first conductivity type impurity having a concentration of $1 \times 10^{20}$ cm$^{-3}$ or more, and that the step of forming a gate electrode of the MIS transistor and an emitter electrode of the bipolar transistor should be carried out so as to dope the second conductor film with the first conductivity type impurity having a concentration of $1 \times 10^{20}$ cm$^{-3}$ or more.

In that case, it is preferable that the step of forming an emitter diffusion layer of the bipolar transistor should be carried out so as to perform heat treatment in such a manner that the emitter diffusion layer of the bipolar transistor has a depth of 0.2 $\mu$m or less and a maximum impurity concentration of $8 \times 10^{19}$ cm$^{-3}$ or more.

DETAILED DESCRIPTION OF THE INVENTION (FIRST EMBODIMENT)

FIGS. 1–7 show a manufacturing process of a semiconductor device according to the first embodiment.

Figure 1:
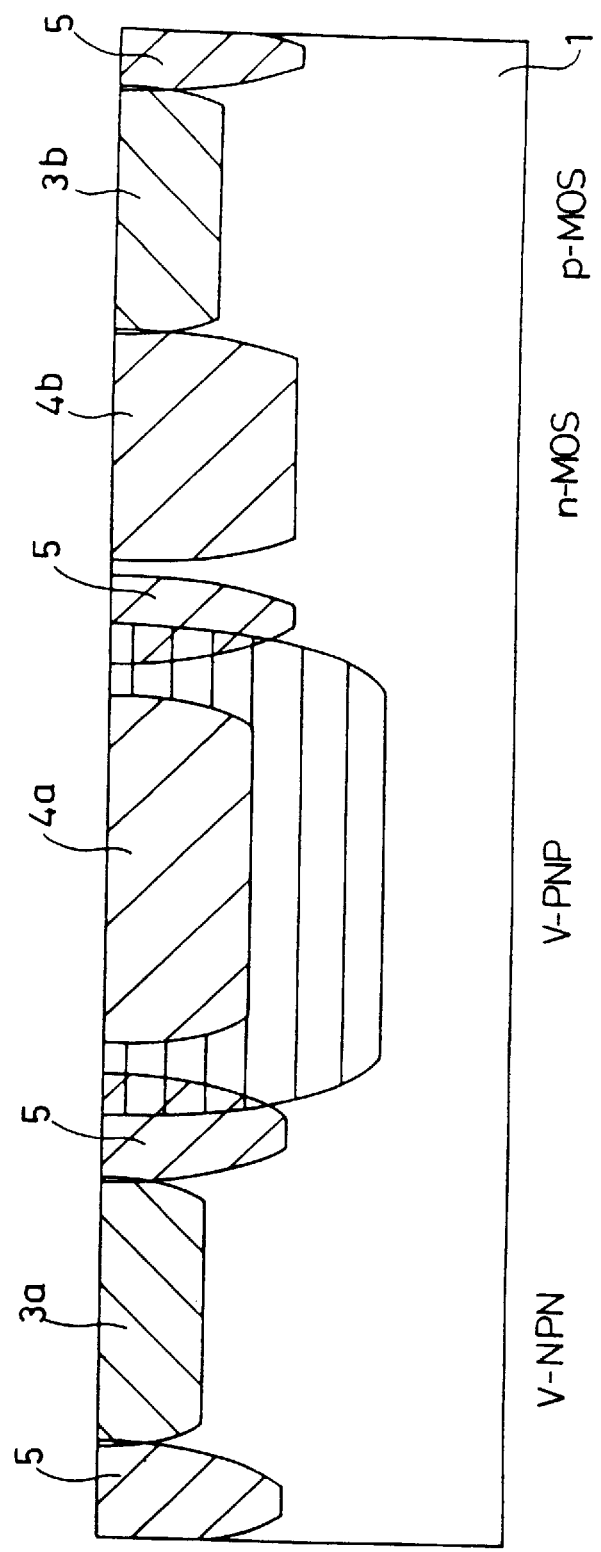
FIG. 1 is a section of a substrate on which a lower buried region a lower isolation region and the like are formed in a manufacturing process according to a first embodiment.

First, as shown in FIG. 1, after phosphorus ions are implanted to a P-type (111) silicon substrate 1 of 10–20Ω·cm resistivity under conditions of 40 keV and $1 \times 10^{13}$ cm$^{-2}$, heat treatment at 1200° C. is conducted for 120 minutes to form an N$^-$ type buried layer 2 for isolating a collector region of a vertical PNP transistor from the P-type silicon substrate 1. After arsenic ions are implanted using a resist as a mask under conditions of 60 keV and $2 \times 10^{15}$ cm$^{-2}$, the heat treatment at 900° C. is conducted for 30 minutes to form collector buried layers 3a of the vertical NPN transistor and an N$^+$ type buried layer 3b to be a substrate buried layer of a P-channel type MOS transistor. Then, after boron ions are implanted using the resist as a mask under conditions of 40 keV and $1 \times 10^{14}$ cm$^{-2}$, the heat treatment at 1100° C. is conducted for 180 minutes to form a P$^+$ type buried layer 4a to be a collector buried layer of a vertical PNP transistor, a P$^+$ type buried layer 4b to be a substrate buried layer of an N-channel type MOS transistor and a P$^+$ type spare isolation region 5 to be a lower part isolation region at a part of an element isolation region. In this case, since the impurity diffusion coefficients of the arsenic, the boron and the phosphorus increase in this order, the $N^+$ type buried layers 3a, 3b, the $P^+$ type buried layers 4a, 4b, the spare isolation region 5 and the $N^-$ type buried layer 2 become deeper in this order.

Figure 2:
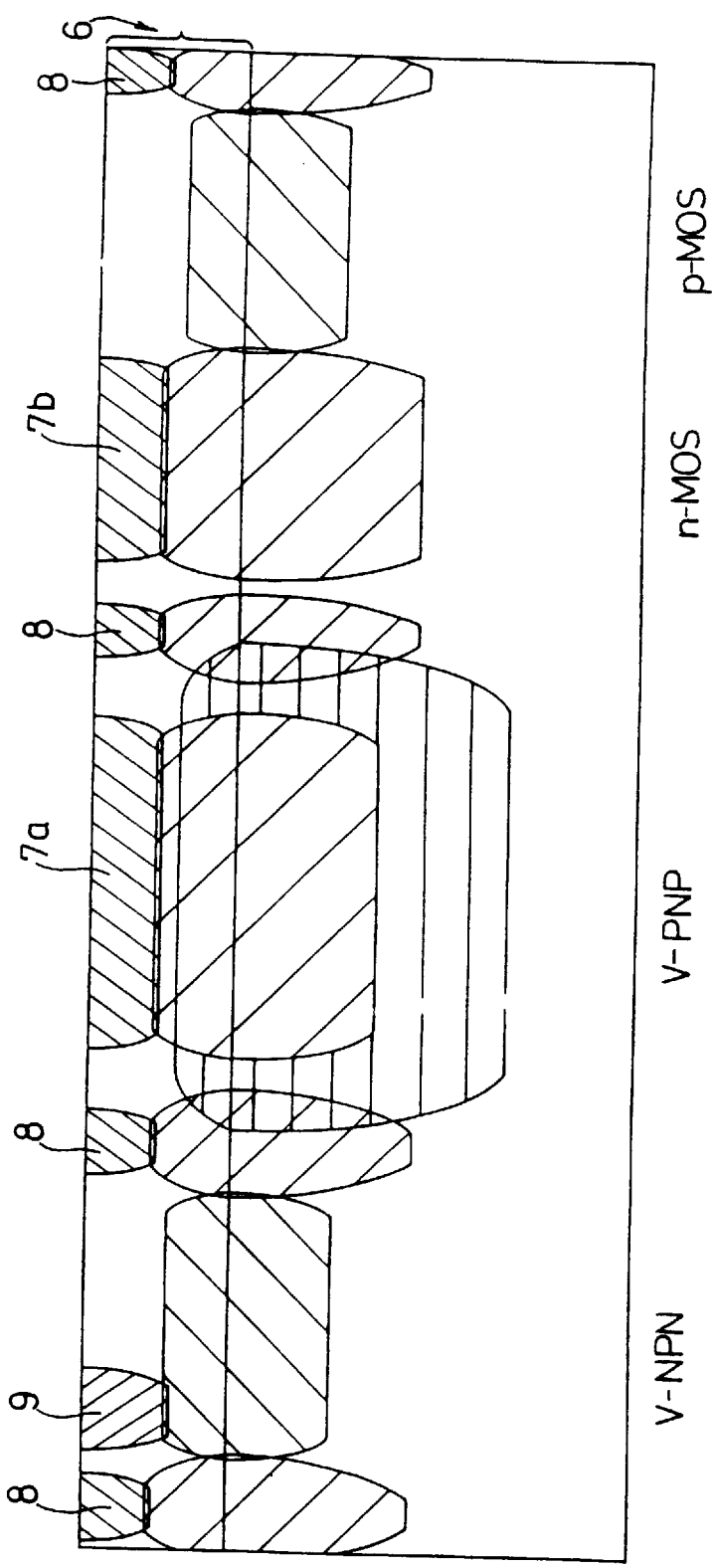
FIG. 2 is a section of the substrate on which an epitaxial layer is formed in the manufacturing process according to the first embodiment.

Next, as shown in FIG. 2, an $N^-$ type epitaxial layer 6 of 1Ω·cm resistivity and 2.5 μm thickness is formed on the P-type silicon substrate 1. After the born ions are implanted using the resist as a mask under conditions of 80 keV and $2\times10^{12}$ cm$^{-2}$, the heat treatment at 1100° C. is conducted for 100 minutes to form a $P^-$ type diffusion layer 7a to be a part of a collector region of the vertical PNP transistor, $P^-$ type diffusion layer 7b to be a channel region of the N-channel type MOS transistor and a PN isolation region 8 to be an upper isolation region in a part of the element isolation region. In this case, since the impurity diffusion coefficients of the arsenic, the boron and the phosphorus increase in this order, the upward expansion amounts of the $N^+$ type buried layers 3a, 3b, the $P^+$ type buried layers 4a, 4b, the spare isolation region 5 and the $N^-$ type buried layer 2 increase in this order. After the phosphorus ions are implanted using the resist as a mask under conditions of 80 keV and $3\times10^{15}$ cm$^{-2}$, the heat treatment at 950° C. is conducted for 30 minutes, then the heat treatment at 1000° C. is conducted for 145 minutes to form an $N^+$ type diffusion layer 9 to be a collector wall region of the vertical NPN transistor.

Figure 3:
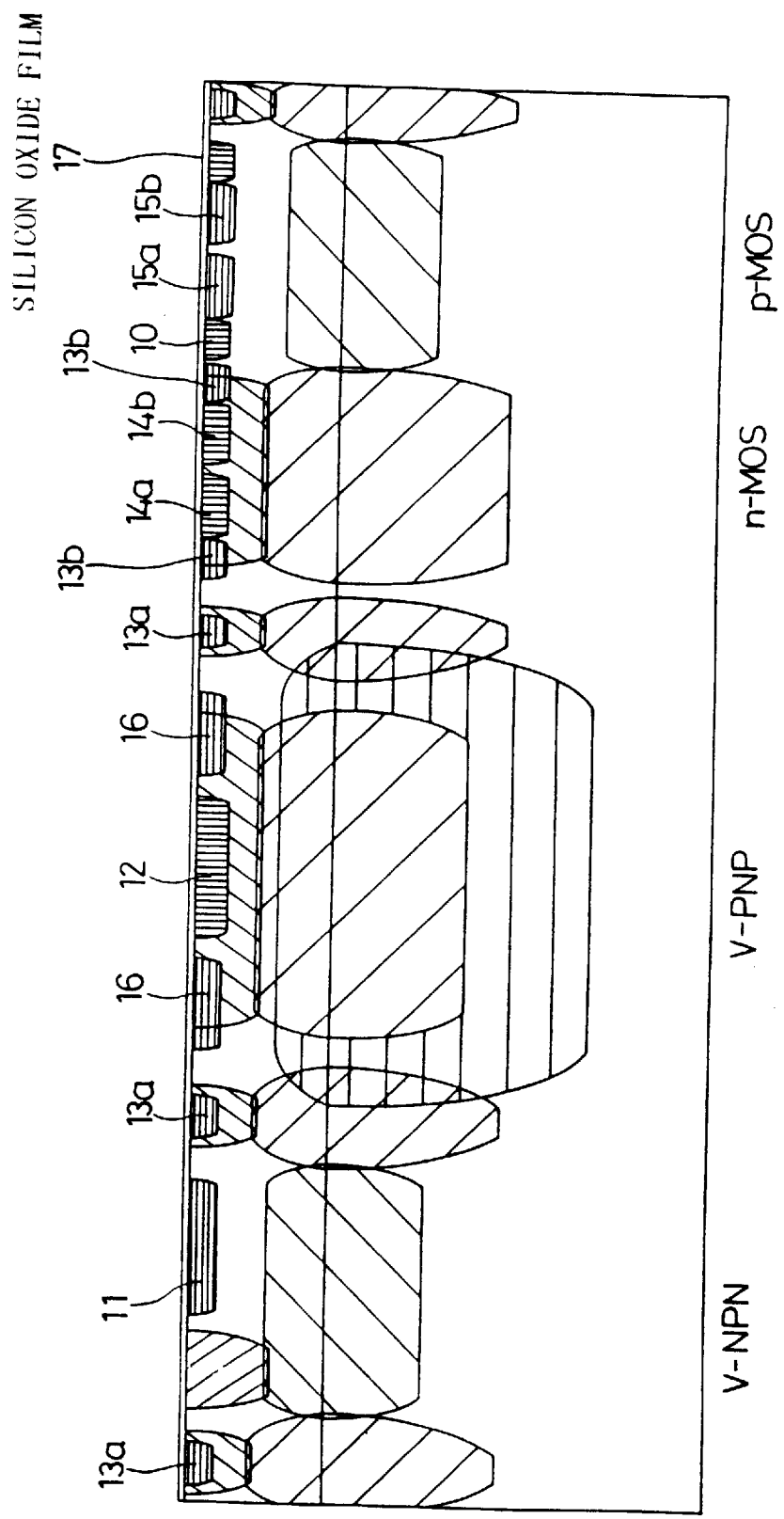
FIG. 3 is a section of the substrate on which ion-implantation into an active region is conducted and a silicon oxide film is formed in the manufacturing process according to the first embodiment.

Next, as shown in FIG. 3, after the boron ions are implanted using the resist as a mask under conditions of 30 keV and $2\times10^{13}$ cm$^{-2}$, the heat treatment at 900° C. is conducted for 30 minutes to form a $P^-$ type active base layer 11 to be a base region of the vertical NPN transistor, a $P^-$ type diffusion layer 16 to be a collector wall region of the vertical PNP transistor, a $P^-$ type channel stopper 13a to be a channel stopper of the N-channel type MOS transistor, $P^-$ type diffusion layers 15a, 15b to be respectively a source and a drain of the P-channel type MOS transistor and a $P^-$ type isolating diffusion layer 13b to be a part of the element isolation region. The phosphorus ions are implanted using the resist as a mask under conditions of 80 keV and $4\times10^{13}$ cm$^{-2}$, then formed are an $N^-$ type active base layer 12 to be a base region of the vertical PNP transistor, an $N^-$ type channel stopper 10 to be a channel stopper of the P-channel type MOS transistor, $N^-$ type diffusion layers 14a, 14b to be respectively a source and a drain of the N-channel type MOS transistor. Next, dry-oxidization at 900° C. is conducted for 30 minutes to form a silicone oxide film 17 of 18 nm thickness which is a dielectric film.

Figure 4:
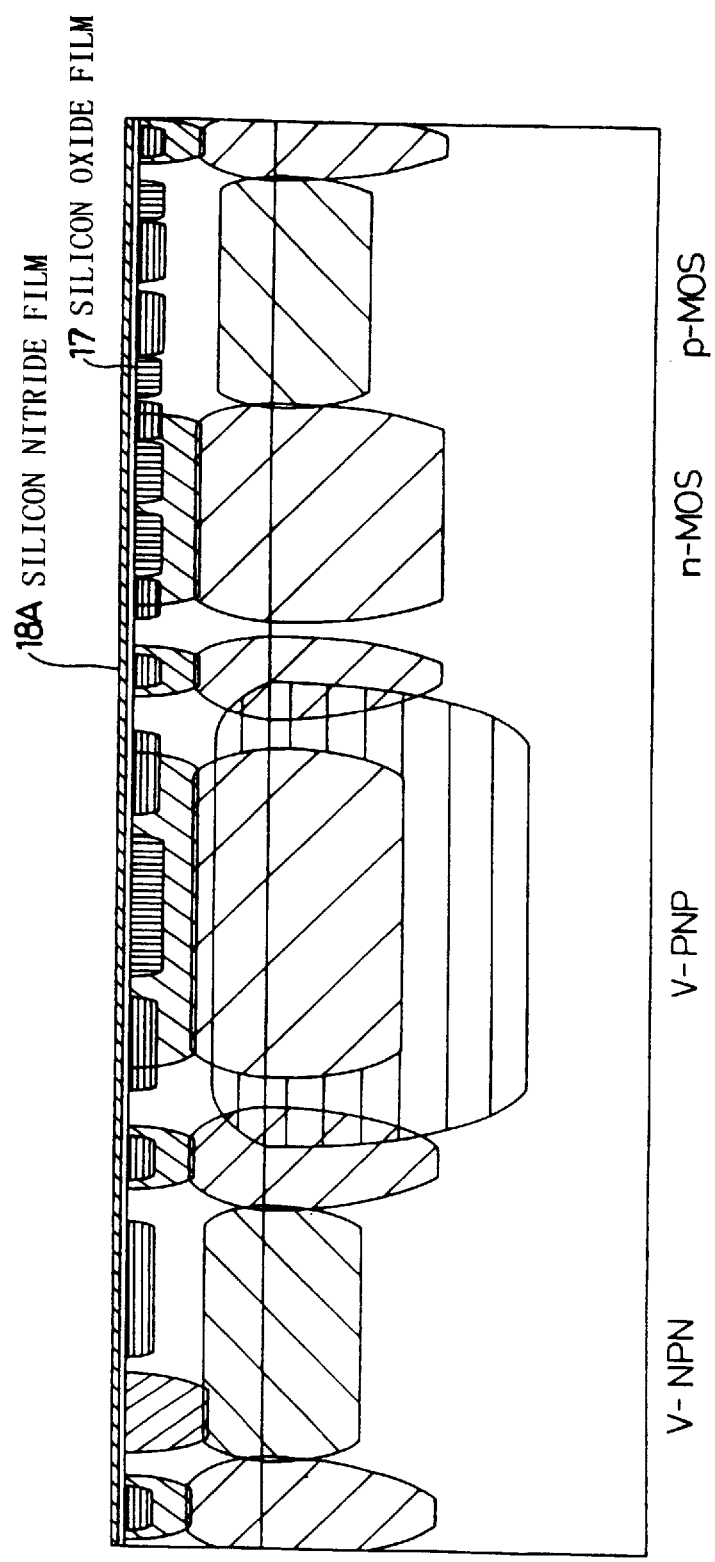
FIG. 4 is a section of the substrate on which a silicon nitride film is formed in the manufacturing process according of the first embodiment.

Then, as shown in FIG. 4, after the silicone oxide film 17 is formed, a silicon nitride film 18A of 50 nm thickness is formed thereon as a protection film. The silicon nitride film 18A is an insulator film for isolating the polysilicon emitter electrode from the active base diffusion layer of the vertical NPN transistor and the vertical PNP transistor. The silicon oxide layer 17 is for the N-channel type MOS transistor and the P-channel type MOS transistor.

Figure 5:
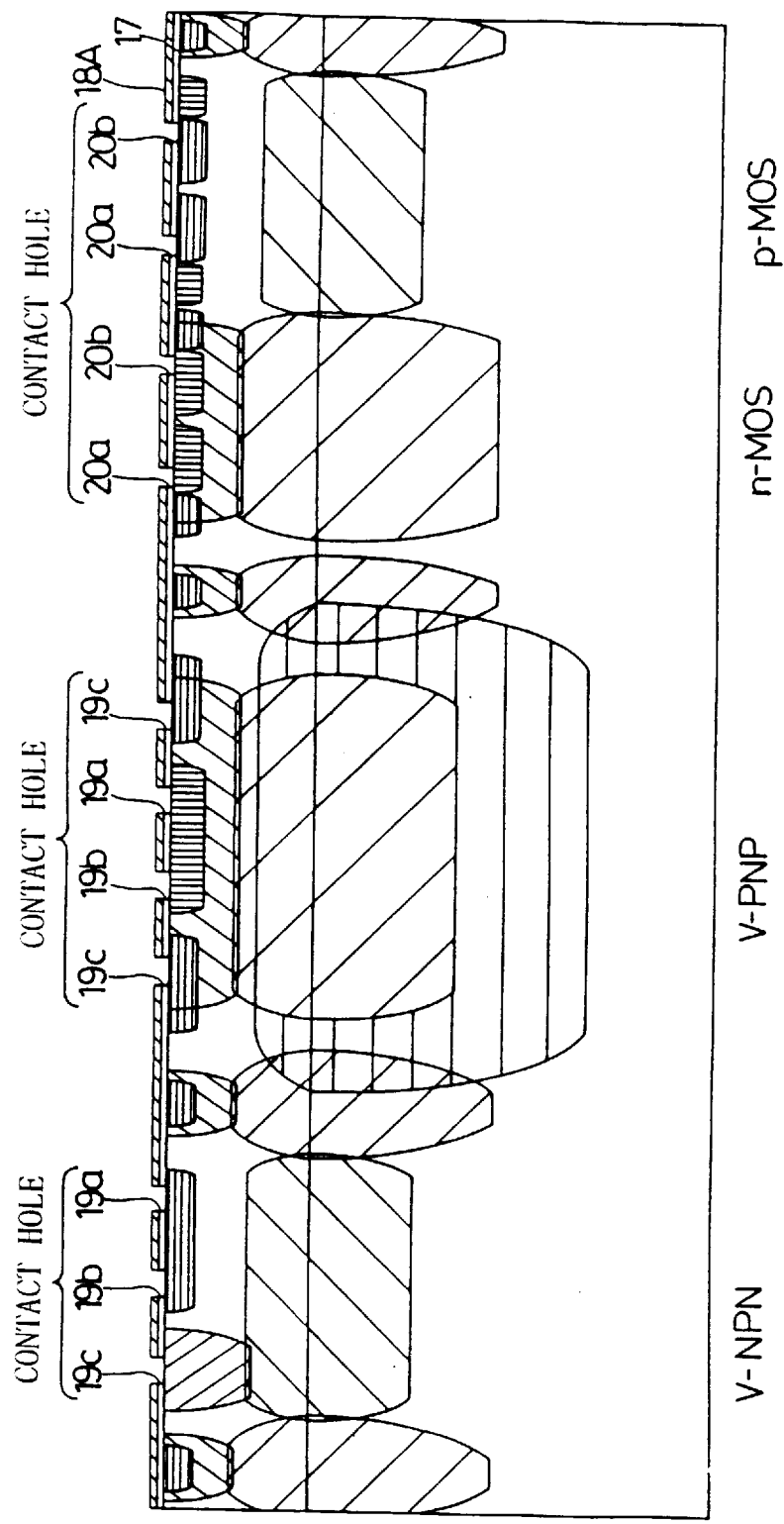
FIG. 5 is a section of the substrate on which a contact hole of a bipolar transistor is formed in the manufacturing process according to the first embodiment.

Next, as shown in FIG. 5, the silicon nitride film 18A and the silicon oxide film 17 are dry-etched using the resist as a mask to form collector contact holes 19c, base contact holes 19b, emitter contact holes 19a (for diffusion) of the vertical NPN transistor and the vertical PNP transistor, and source contact holes 20a and drain contact holes 20b of the N-channel type MOS transistor and the P-channel type MOS transistor.

Figure 6:
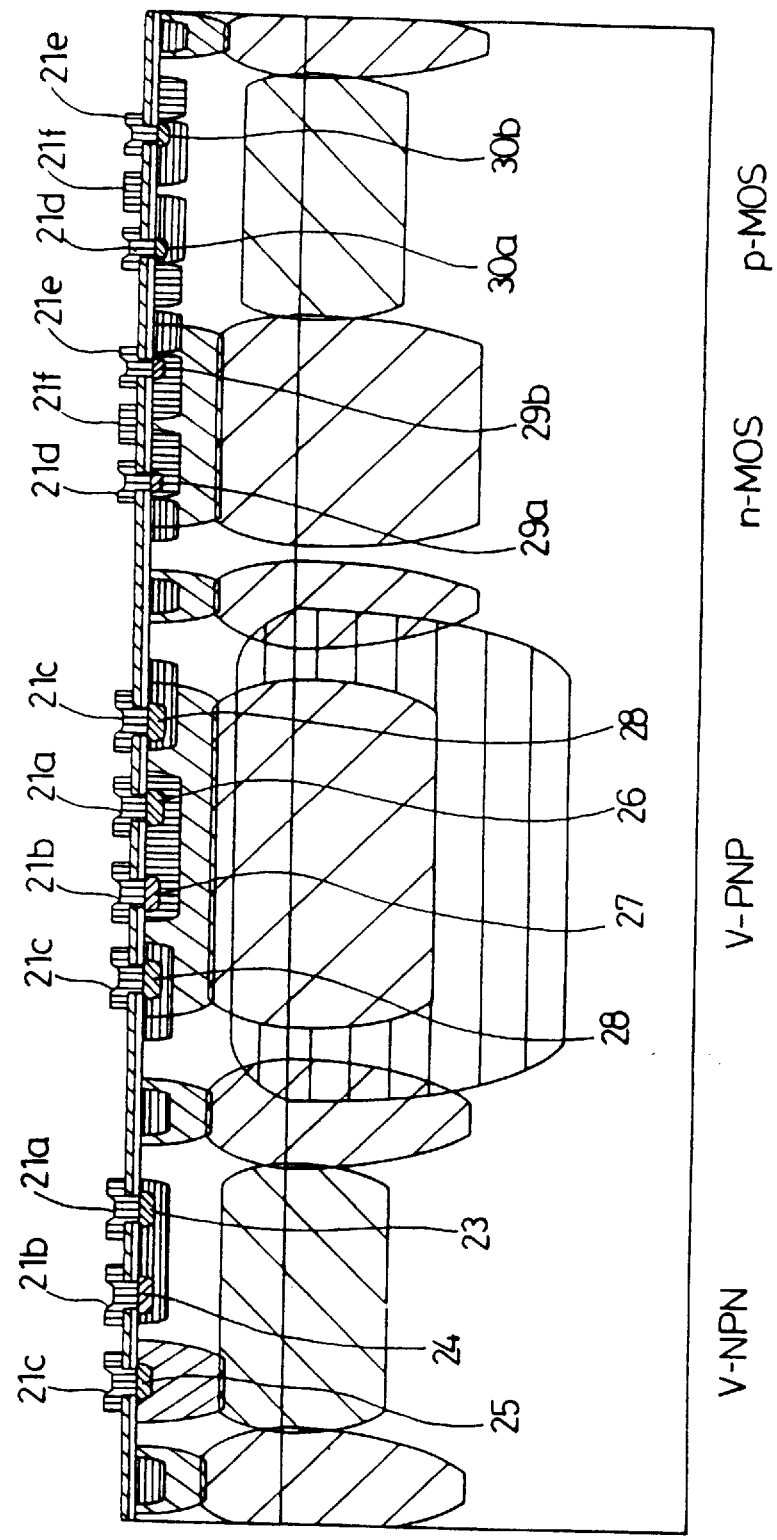
FIG. 6 is a section of the substrate on which a polysilicon electrode is formed in the manufacturing process according to the first embodiment.

Next, as shown in FIG. 6, after a polysilicon film 21 of 300 nm thickness is formed according to a low pressure CVD method, the polysilicon film 21 is dry-etched to form emitter electrodes 21a, base electrodes 21b and collector electrodes 21c of the vertical NPN transistor and the vertical PNP transistor and source electrodes 21d, drain electrodes 21e and gate electrodes 21f of the N-channel type MOS transistor and the P-channel type MOS transistor. The arsenic ions are implanted into the polysilicon film 21, using the resist as a mask, under conditions of 60 keV and $1\times10^{16}$ cm$^{-2}$, then the heat treatment at 950° C. is conducted for 60 minutes, so that the arsenic ions are diffused from the polysilicon film 21 to form an $N^+$ base contact 27 of the vertical PNP transistor, an $N^+$ collector contact 25 and an $N^+$ emitter layer 23 of the vertical NPN transistor, and an $N^+$ source contact 29a and an $N^+$ drain contact 29b of the N-channel type MOS transistor. Further, the boron ions are implanted into the polysilicon film 21, using the resist as a mask, under conditions of 30 keV and $5\times10^{15}$ cm$^{-2}$, and the heat treatment at 900° C. is conducted for 60 minutes so that the boron ions are diffused from the polysilicon film 21 to form a $P^+$ base contact 24 of the vertical NPN transistor, a $P^+$ collector contact 28 and a $P^+$ emitter layer 26 of the vertical PNP transistor, and a $P^+$ source contact 30a and $P^-$ drain contact 30b of the P-channel type MOS transistor.

Figure 7:
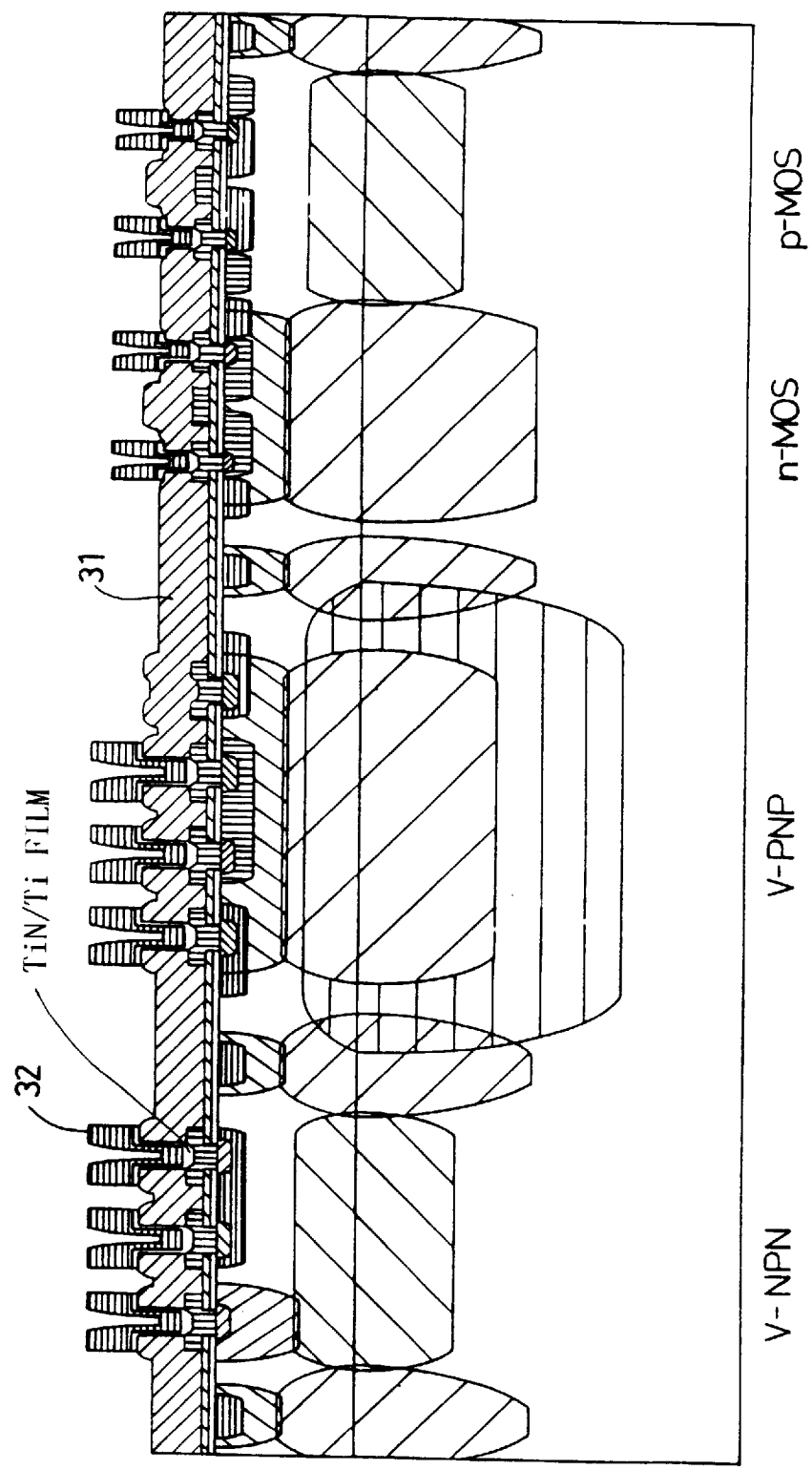
FIG. 7 is a section of the substrate on which an Al wiring is formed in the manufacturing process according to the first embodiment.

As shown in FIG. 7, an NSG film 31 of 800 nm thickness is formed as an insulator layer between respective electrodes according to the low pressure CVD method, and the NSG film 31 on each electrode are dry-etched using the resist as a mask. Finally, an underlayer composed of TiN/Ti film and an Al film are sequentially formed as a metallic electrode, using a sputter, and an Al wiring 32 to be an Al electrode wiring is formed using the resist as a mask.

As described above, according to the first embodiment, since the silicon nitride film 18A as the protection film is formed on the silicon oxide film 17 to be the gate insulator film of the MOS transistor, the silicon oxide film 17 is protected by the high-density silicon nitride film 18A so that contamination accompanied by resist coating and etching is prevented at the formation of the contact holes such as the emitter contact holes 19a, the source contact holes 20a by dry-etching using the resist as a mask. In detail, until the formation of the polysilicon film 21 to be the gate electrode 21f from the formation of the silicon nitride film 18A, the silicon nitride film 18A to be a part of the gate insulator film of the MOS transistor is exposed to various kinds of contamination sources because of the formation of the emitter contact holes 19a and the like, using the resist as a mask. However, since the composition of the silicon nitride film 18A is too dense to permeate contamination matters into the silicon nitride film 18A and to have the silicon oxide film 17 contaminated through the silicon nitride film 18A. Further, when a surface of the silicon nitride film 18A contaminated is well cleaned before the formation of the polysilicon film 21, a clean surface is obtained. Thus, an excellent MOS transistor and a bipolar transistor are formed at the same time because of the clean gate electrodes 21f with clean gate insulator film.

Further, the silicon oxide film 17 and the silicon nitride film 18A serve as the gate insulator film of the MOS transistor and as the isolation insulator film between the emitter electrode 21a and the subsurface silicon substrate of the bipolar transistor, with a result that a step for removing the silicon nitride film 18A is unnecessary.

Particularly, when the protection film is the silicon nitride film 18A, the silicon oxide film 17 is covered with the silicon nitride film 18A so that the silicon oxide film 17 and the silicon nitride film 18A are not etched even though a dip-etching with hydrogen fluoric acid required for removing a natural oxide film is conducted immediately before the polysilicon film 21 is formed after the formation of contact holes such as the emitter contact holes 19a.

Therefore, degradation and deficiency of characteristic of the MOS transistor whose gate insulator film is the silicon oxide film 17 and the silicon nitride film 18A are prevented without thickness dispersion of the silicon oxide film 17 and the silicon nitride film 18A and pin holes. Also, as to the bipolar transistor, as well as the MOS transistor, the thickness dispersion of the silicon oxide film 17 and the silicon nitride film 18A and the pin holes are not caused by using the silicon oxide film 17 and the silicon nitride film 18A as the insulator film between the emitter electrode 21a and the silicon surface, thus preventing deficiency in durability to high voltage between the emitter and the base and characteristic degradation due to leakage current therebetween.

The components of the MOS transistor are formed concurrently with the steps of forming the bipolar transistor: for example, the source, the drain diffusion layer and the channel stopper of the MOS transistor are formed concurrently with the formation of the active base layer of the bipolar transistor, the gate electrode of the MOS transistor and the emitter electrode of the bipolar transistor are formed at the same time, and the like. Thus, there is no increase in the numbers of masks and the manufacturing steps, compared with the manufacturing process of the bipolar transistor, with a result of a low cost semiconductor device with Bi-MOS structure.

(SECOND EMBODIMENT)

A second embodiment will be described below.

FIGS. 8 to 13 show a manufacturing process of a semiconductor device according to the second embodiment. The same steps as those shown in FIGS. 1 to 3 according to the first embodiment are conducted prior to the step shown in FIG. 8. More specifically, the same step as shown in FIG. 1 is conducted to form, on a P type (111) silicon substrate 1, an N$^-$ type buried layer 2, a collector buried layer 3a, an N$^+$ type buried layer 3b, P$^+$ type buried layers 4a and 4b, a P$^+$ type spare isolation region 5, an N$^-$ type epitaxial layer 6, P$^-$ type diffusion layers 7a and 7b, a PN isolation region 8, an N$^+$ type diffusion layer 9, an N$^-$ type channel stopper 10, a P$^-$ type active base layer 11, an N$^-$ type active base layer 12, a P$^-$ type channel stopper 13a, a P$^-$ type isolating diffusion layer 13b, N$^-$ and P$^-$ type diffusion layers 14a, 14b and 15a, 15b to be sources and drains respectively, and a P$^-$ type diffusion layer 16. In FIGS. 8 to 13, portions provided below the N-epitaxial layer 6 are almost omitted, and a part of regions between transistors are also omitted because they do not influence the contents of the invention.

Figure 8:
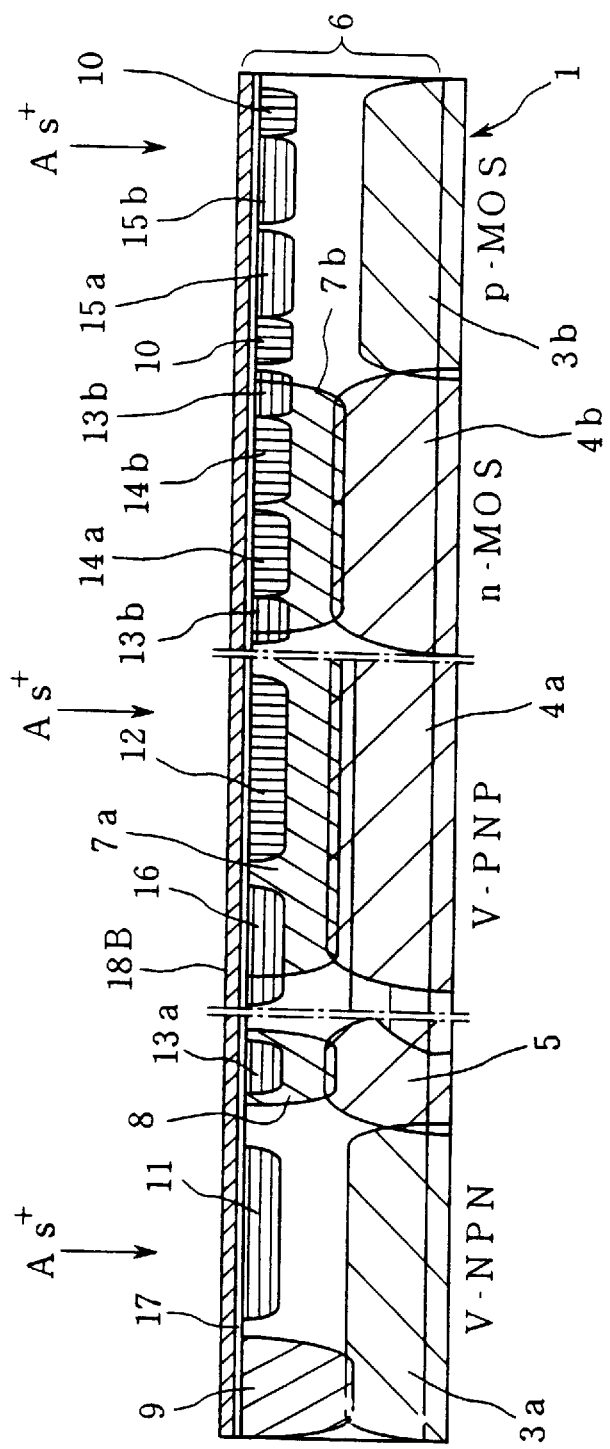
FIG. 8 is a section of a substrate on which a polysilicon film is formed in a manufacturing process according to a second embodiment.

Immediately after the step of forming a silicon oxide film 17 shown in FIG. 3, a polysilicon film 18B of about 100 nm thickness which also serves as a protection film is formed according to a low pressure CVD method as shown in FIG. 8, instead of the silicon nitride film 18A shown in FIG. 4. Then, arsenic (As+) ions are implanted into the polysilicon film 18B under conditions of 60 keV and 1×10$^{16}$ cm$^{-2}$ so that the polysilicon film 18B is changed to have an N$^+$ type.

In this case, it is preferable that the impurity (arsenic in the present embodiment) of the polysilicon film 18B should have a concentration of 1×10$^{20}$ cm$^{-3}$ or more. Also in third, fifth and sixth embodiments to be described below, this condition should be met to form an emitter diffusion layer having a very high impurity concentration at the following steps. It is not necessary to always perform doping with an impurity such as arsenic by ion implantation. The arsenic or the like may be contained during CVD or vapor phase diffusion may be performed for doping with arsenic or the like after the polysilicon film is formed, which will be the same as in the third, fifth and sixth embodiments to be described below.

Figure 9:
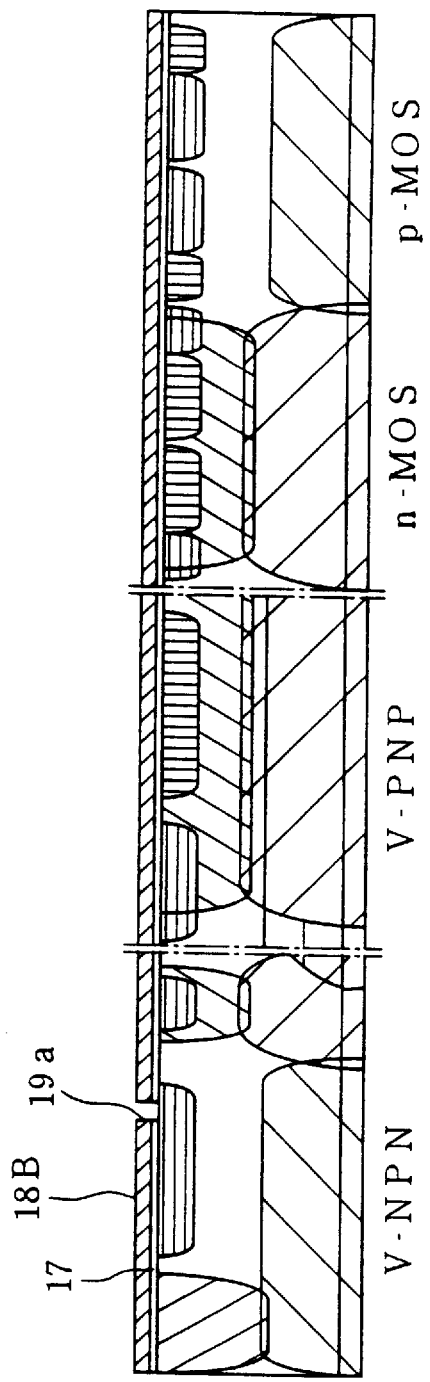
FIG. 9 is a section of the substrate on which a contact hole of a bipolar transistor is formed in the manufacturing process according to the second embodiment.

As shown in FIG. 9, dry-etching is performed by using a resist film (not shown) as a mask to selectively remove the polysilicon film 18B and the silicon oxide film 17, and a contact hole 19a for an emitter layer of a vertical NPN transistor is formed.

Figure 10:
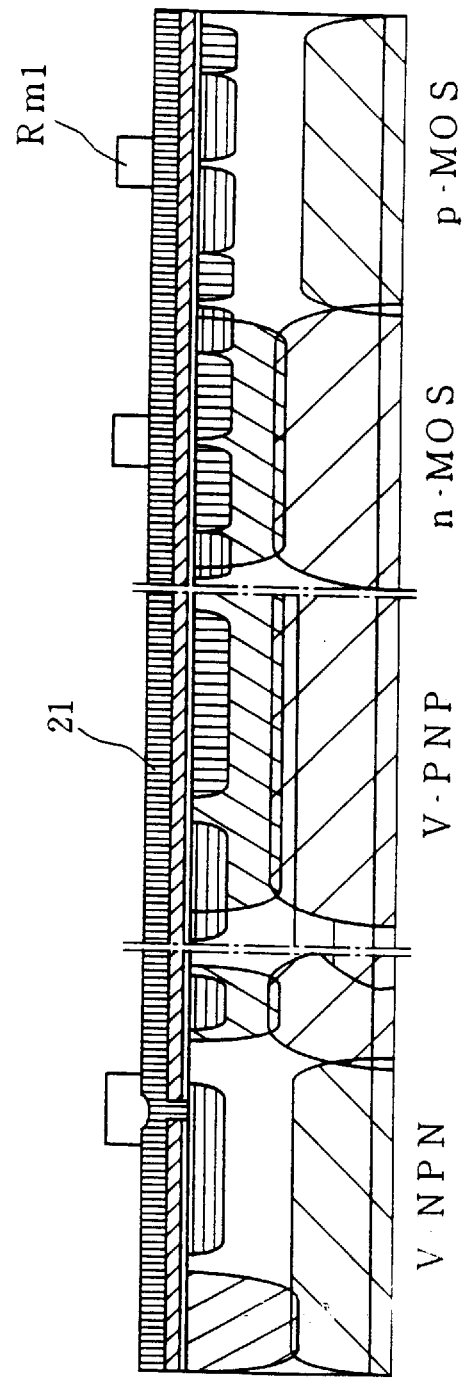
FIG. 10 is a section of the substrate where a resist film is formed on the polysilicon film in the manufacturing process according to the second embodiment.

Next, as shown in FIG. 10, a polysilicon film 21 of about 300 nm thickness is formed on the substrate according to the low pressure CVD method. Then, a resist film Rm1 is formed on the polysilicon film 21 so as to cover a region where an emitter electrode of the vertical NPN transistor is to be formed and a region where a gate electrode of each MOS transistor is to be formed.

Figure 11:
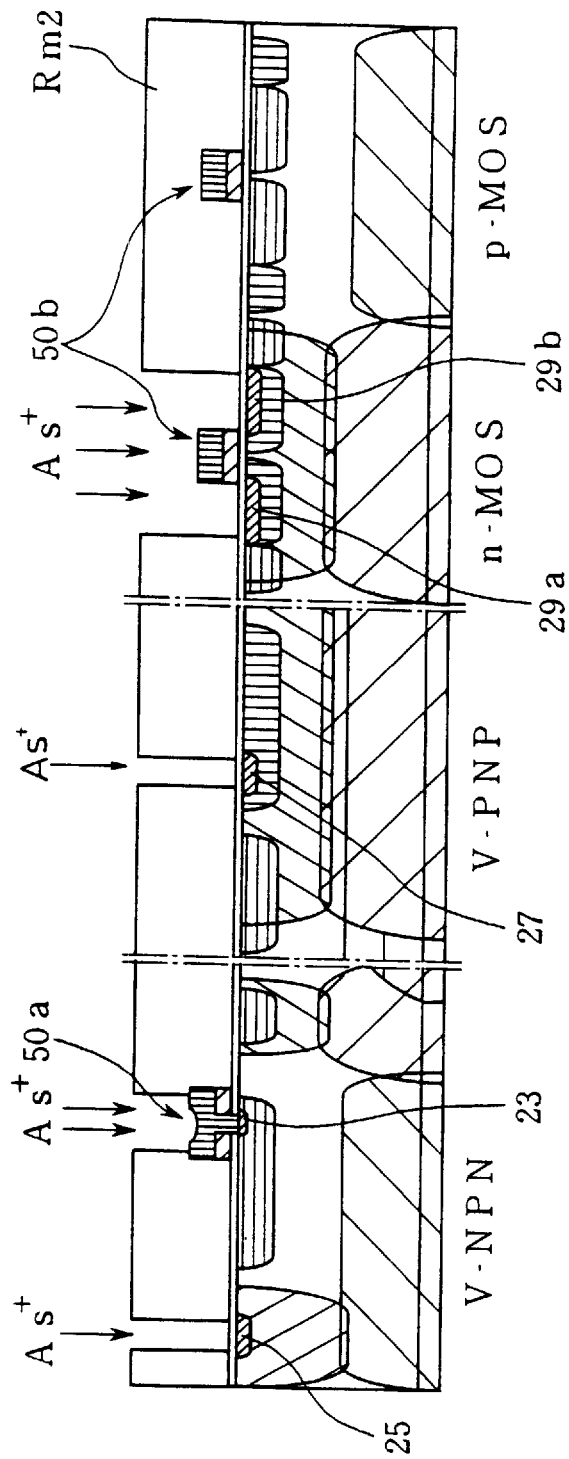
FIG. 11 is a section of the substrate where arsenic ions are implanted into each electrode and a contact layer in the manufacturing process according to the second embodiment.

Next, as shown in FIG. 11, the polysilicon films 18B and 21 are patterned according to a dry-etching method so that an emitter electrode 50a of the vertical NPN transistor and a gate electrode 50b of NMOS and PMOS transistors are formed. In the present embodiment, a base electrode, a collector electrode, a source electrode and a drain electrode which are made of a polysilicon film are not formed unlike the first embodiment. Then, a resist film Rm2 is formed on the substrate to open a region where a collector contact layer of the vertical NPN transistor is to be formed, portions other than both ends of the emitter electrode 50a of the vertical NPN transistor, a region where a base contact of the vertical PNP transistor is to be formed, and regions where a gate electrode of an N-channel type MOS transistor and source-drain contact layers on both sides thereof are to be formed. Arsenic (As+) ions are implanted into the polysilicon film 21 and the silicon substrate under conditions of 60 keV and 1×10$^{16}$ cm$^{-2}$ by using the resist film Rm2 as a mask. Thereafter, heat treatment at 950° C. is conducted for 60 minutes to diffuse the arsenic in silicon. By the diffusion treatment, it is possible to obtain the structure of the emitter layer of a bipolar transistor as the features of the present invention. In other words, the arsenic is diffused from the polysilicon films 18B and 21 forming the emitter electrode 50a into the silicon. Thus, an N$^+$ emitter layer 23 of the vertical NPN transistor which has a high impurity concentration and is shallow is formed. By the diffusion treatment, an N$^+$ base contact portion 27 of the vertical PNP transistor, an N$^+$ collector contact portion 25 of the vertical NPN transistor, and an N$^+$ source contact portion 29a and an N$^+$ drain contact portion 29b of the N-channel type MOS transistor are formed.

In this case, it is preferable that the impurity (arsenic in the present embodiment) in the polysilicon film 21 should have a concentration of 1×10$^{20}$ cm$^{-3}$ or more. Furthermore, it is preferable that an N$^+$ emitter diffusion layer 23 having an impurity concentration of 8×10$^{19}$ cm$^{-3}$ or more in a maximum concentration position and a depth of 0.2 μm or less should be formed by heat treatment. This condition should be met in the third, fifth and sixth embodiments to be described below in order to form an NPN transistor having high performance, for example, a high current amplification factor or the like. It is not necessary to always perform doping with an impurity such as arsenic by ion implantation. The arsenic or the like may be contained in the polysilicon film during CVD or vapor phase diffusion may be performed for doping with the arsenic or the like after the polysilicon film is formed at the step shown in FIG. 10. Arsenic ions or the like may be implanted into the polysilicon film 21 before the resist film Rm1 is formed at the step shown in FIG. 10. Also in the third, fifth and sixth embodiments to be described below, these steps can be changed in the same manner as in the present embodiment.

Figure 12:
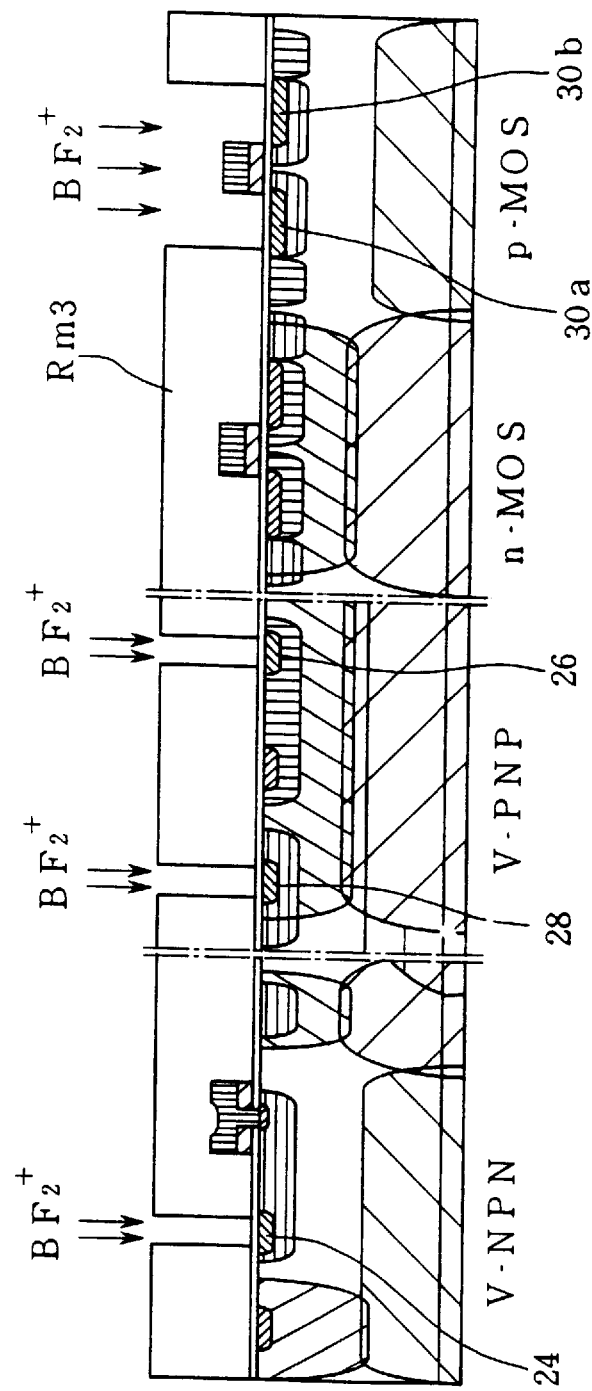
FIG. 12 is a section of the substrate where boron fluoride ions are planted into each electrode and the contact layer in the manufacturing process according to the second embodiment.

Next, as shown in FIG. 12, a resist film Rm3 is formed to open a region where a base contact layer of the vertical NPN transistor is to be formed, regions where a collector contact and an emitter contact of the vertical PNP transistor are to be formed, and regions where a gate electrode of a P-channel type MOS transistor and a source-drain contact on both sides thereof are to be formed. Boron fluoride (BF2+) ions are implanted into the polysilicon film 21 and the silicon under conditions of 30 keV and $5 \times 10^{15}$ cm$^{-2}$ by using the resist film Rm3 as a mask. Thereafter, heat treatment at 900° C. is conducted for 60 minutes to diffuse boron in the polysilicon film 21 and the silicon. By the diffusion treatment, a P$^+$ base contact portion 24 of the vertical NPN transistor, a P$^+$ collector contact portion 28 of the vertical PNP transistor, a P$^+$ emitter layer 26 of the vertical PNP transistor and a P$^+$ source contact portion 30a and a P$^+$ drain contact portion 30b of the P-channel type MOS transistor are formed.

Figure 13:
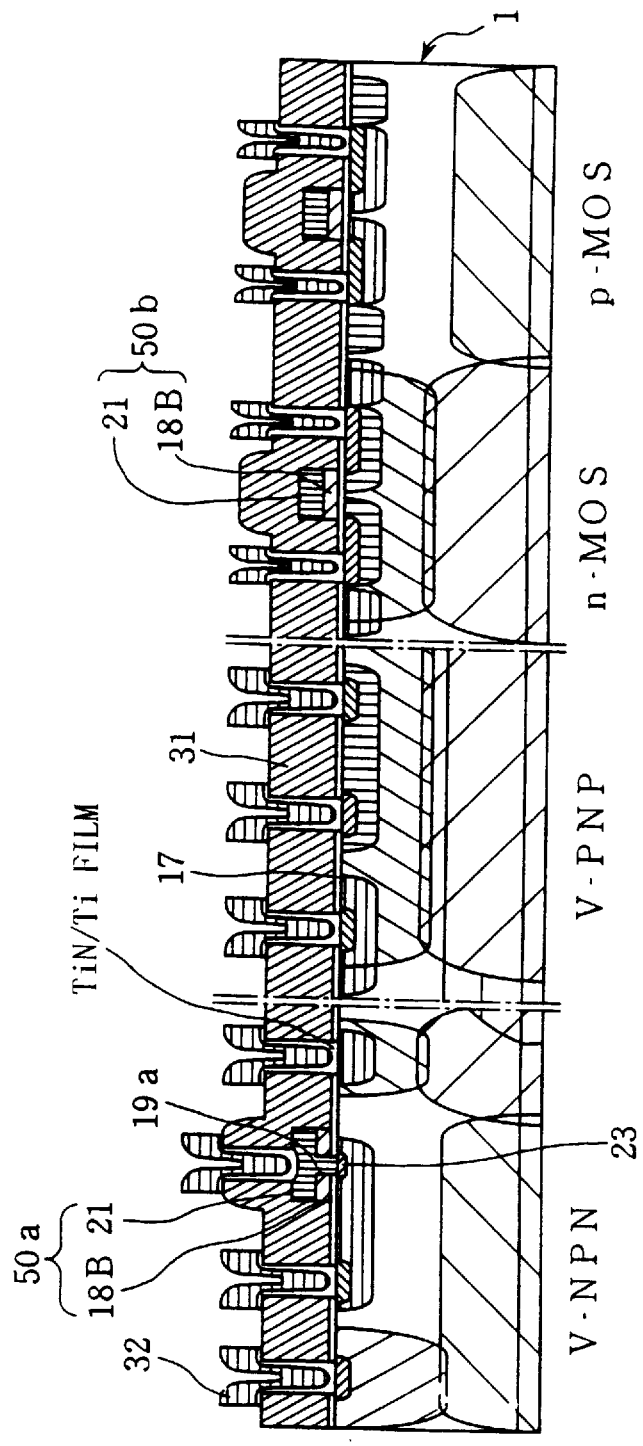
FIG. 13 is a section of the substrate on which an Al wiring is formed in the manufacturing process according to the second embodiment.

Next, as shown in FIG. 13, an NSG film 31 of about 800 nm thickness is formed as an insulator layer between respective electrodes according to the low pressure CVD method. Then, each contact diffusion layer and the NSG film 31 on the polysilicon electrode are dry-etched by using the resist film as a mask. Finally, Al is formed as a metal electrode by sputtering. Subsequently, an Al wiring 32 to be an Al electrode wiring is formed by using the resist film as a mask. For example, a TiN/Ti film or the like is formed as the subsurface film of the Al wiring. According to the present embodiment, the Al wiring 32 is not in contact with the contact layer other than the N$^+$ emitter layer 23 of the vertical NPN transistor through the polysilicon film but through the subsurface film unlike the first embodiment.

As described above, since the same manufacturing process as in the first embodiment is basically performed, the same effects as in the first embodiment are displayed.

As the peculiar effects of the present embodiment, the protection film 18B is made of a conductive polysilicon film and the gate insulator film is made of the silicon oxide film 17. Consequently, the gate insulator film can be made much thinner than that in the first embodiment. Accordingly, a MOS transistor having higher performance can be formed without an increase in the number of masks and manufacturing steps required for forming the bipolar transistor.

Figure 26:
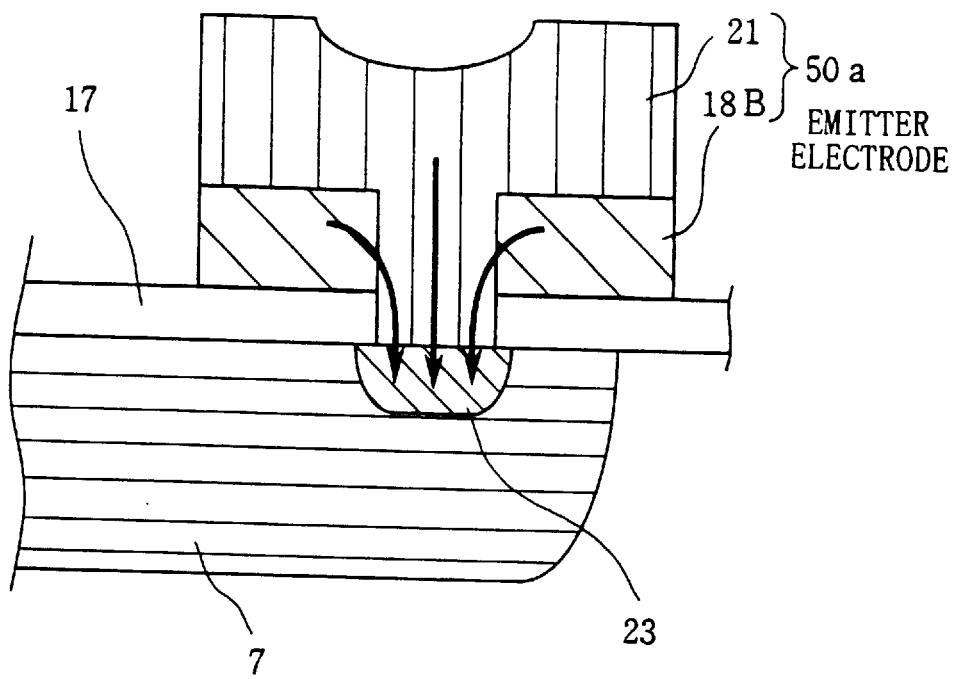
FIG. 26 is a section of a diffusion path of arsenic from an emitter electrode to an emitter layer formed in the manufacturing processes according to the second and third embodiments.
Figure 29:
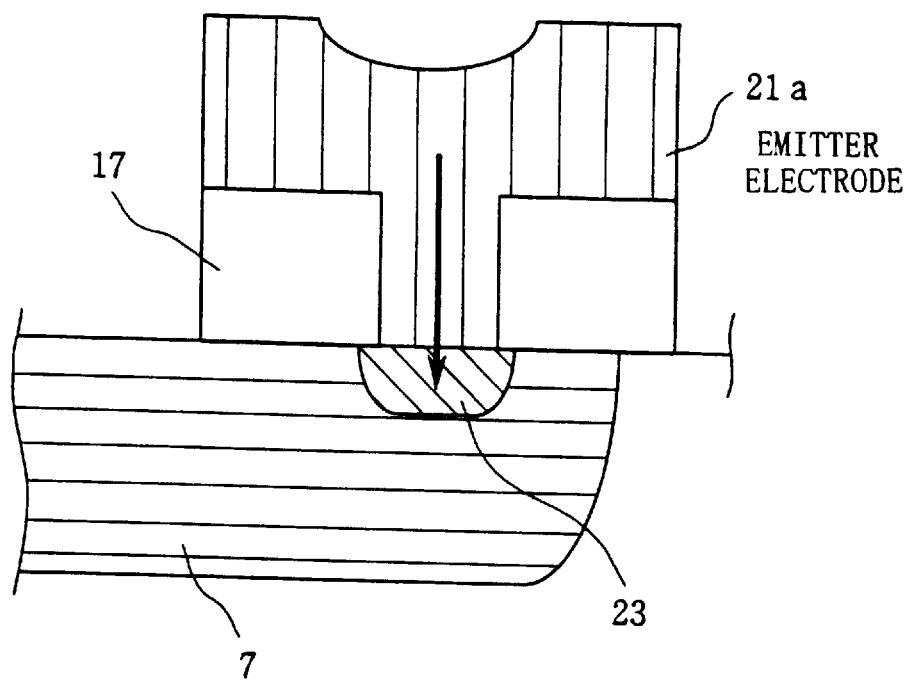
FIG. 29 is a section of a diffusion path of arsenic from an emitter electrode to an emitter layer formed in the manufacturing process according to the prior art.
Figure 30:
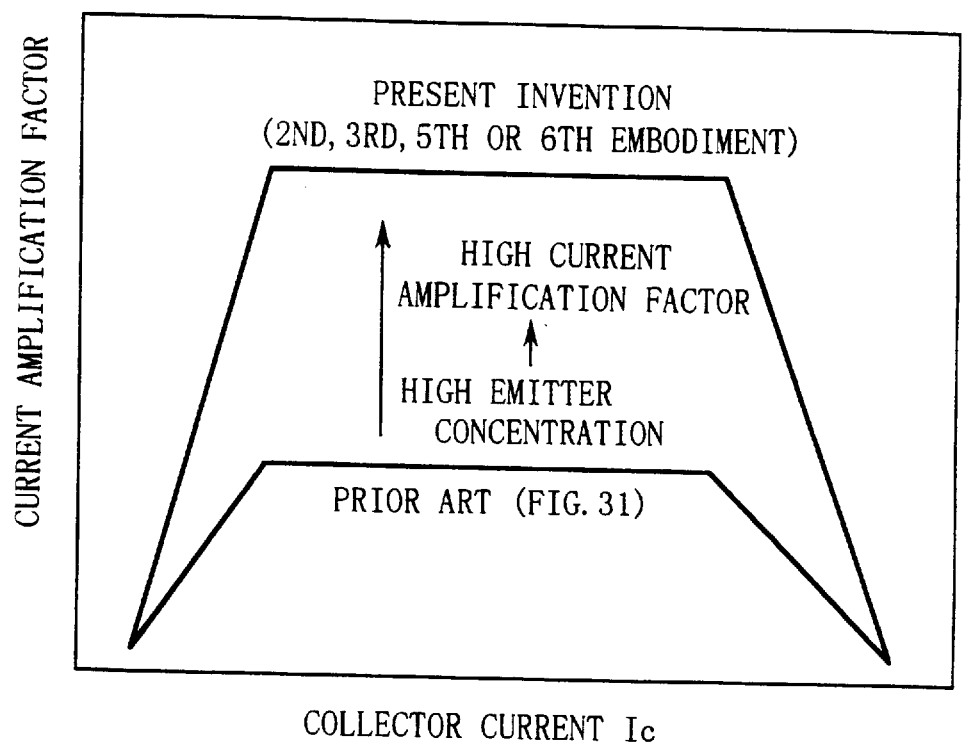
FIG. 30 is a characteristic chart for comparing the current amplification factors of bipolar transistors formed in the manufacturing process according to the prior art and in the manufacturing process according to the second, third, fifth or sixth embodiment.
Figure 31:
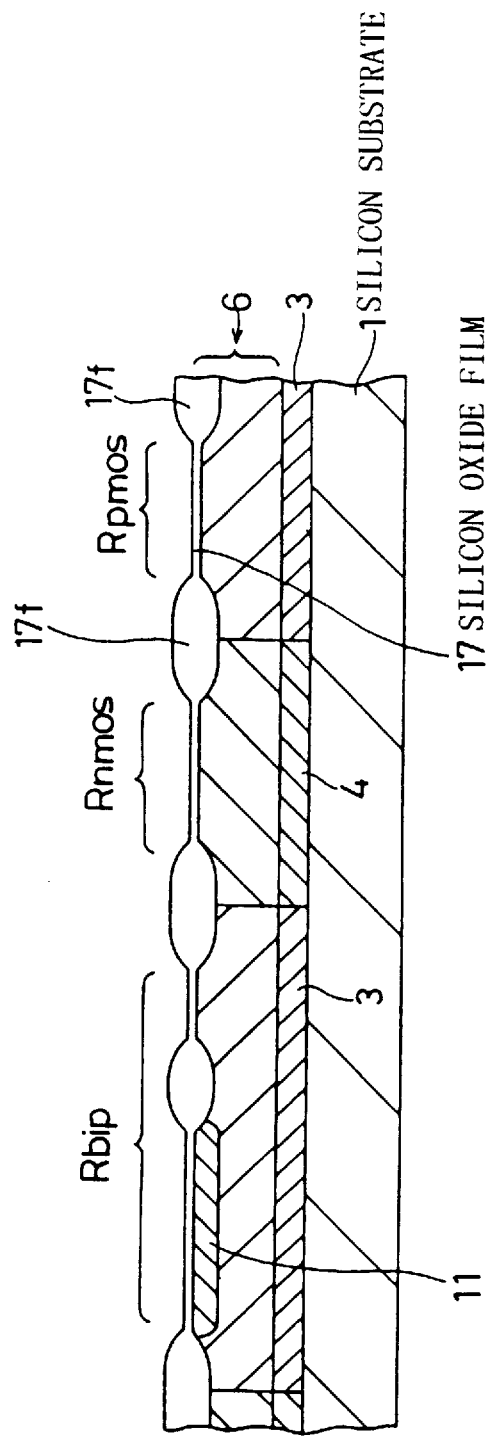
FIG. 31 is a section of a substrate on which a buried region and a silicon oxide film are formed in the manufacturing process of a semiconductor device according to the prior art.
Figure 32:
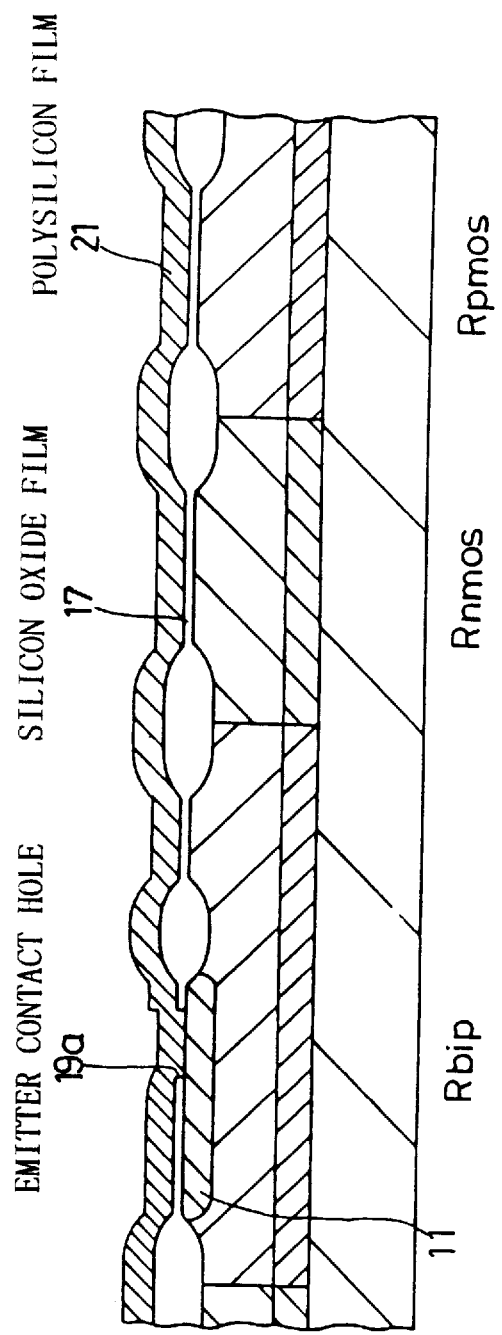
FIG. 32 is a section of the substrate on which a polysilicon film is formed in the manufacturing process of the semiconductor device according to the prior art.
Figure 33:
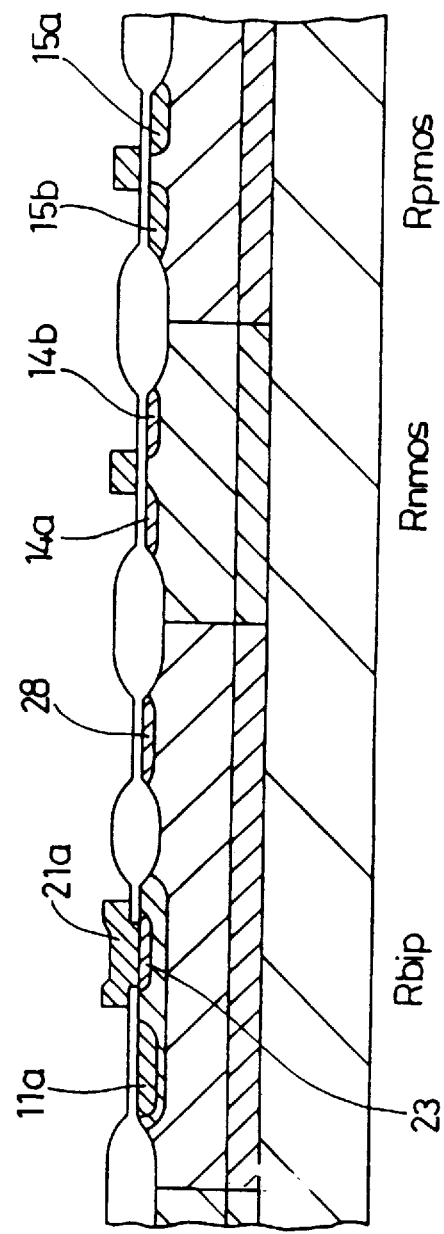
FIG. 33 is a section of the substrate on which the polysilicon electrode is formed in the manufacturing process of the semiconductor device according to the prior art.

As shown in FIG. 26, furthermore, the N$^+$ emitter layer 23 of the vertical NPN transistor is formed by the diffusion of the arsenic from the polysilicon films 18 and 21 so that it can be made shallower than in case of ion implantation. Also in the process according to the prior art shown in FIG. 33, the emitter layer of the vertical NPN transistor can be formed by the diffusion of the arsenic from the polysilicon film. In that case, the impurity is diffused through a single path from the emitter electrode 21a made of the single polysilicon film 21 as shown in FIG. 29. On the other hand, the arsenic can be diffused through two paths of the polysilicon films 21 and 18B forming the emitter electrode 50a in the present embodiment. Consequently, the impurity concentration of the N$^+$ emitter layer 23 can be increased more than in the process according to the prior art. As shown in FIG. 30, thus, hFE of the vertical NPN transistor can be increased more rapidly than in the prior art.

In the present embodiment and the third, fifth and sixth embodiments to be described below, when the impurity concentration of the N$^+$ emitter diffusion layer 23 of the vertical NPN transistor is $8 \times 10^{19}$ cm$^{-3}$ or more in a maximum concentration position and the depth of the N$^+$ emitter diffusion layer 23 is 0.2 $\mu$m or less, it is possible to obtain a current amplification factor hFE which is especially high.

While the openings of the resist films Rm2 and Rm3 are provided in such a manner that the source-drain contact layers 19a, 19b or 30a, 30b are formed in self-alignment with the gate electrode 50b in the regions where the MOS transistors are to be formed at the steps shown in FIGS. 11 and 12 in the present embodiment, the present invention is not restricted to the present embodiment. In other words, each source-drain contact layer may be formed apart from the gate electrode by a predetermined distance so as to cover both ends of the gate electrode 50b and a given portion of both sides thereof by the resist films Rm2 and Rm3.

While the N type impurity, that is, arsenic is introduced into the gate electrode 50b of the N-channel type MOS transistor and the P type impurity, that is, boron is introduced into the gate electrode 50b of the P-channel type MOS transistor to form so-called dual gate structure in the present embodiment, the present invention is not restricted to the present embodiment but other impurities of the same conductivity type may be introduced into the gate electrode of the MOS transistor.

(THIRD EMBODIMENT)

Figure 14:
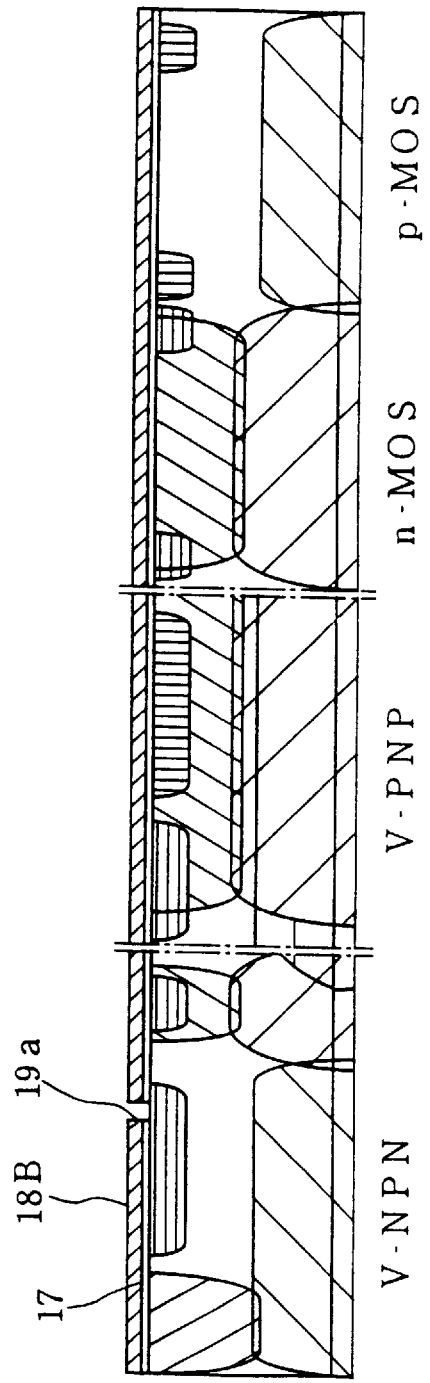
FIG. 14 is a section of a substrate where a silicon oxide film and a polysilicon film are formed and a contact hole is formed on an emitter layer of a bipolar transistor in a manufacturing process according to a third embodiment.
Figure 15:
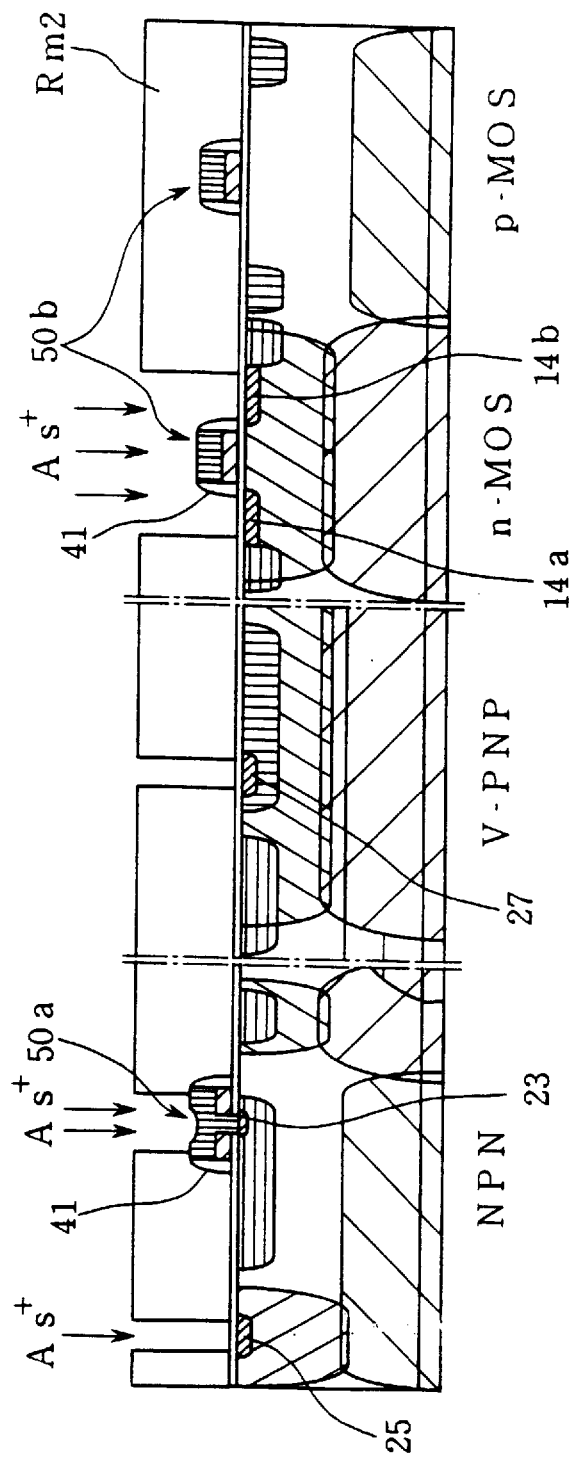
FIG. 15 is a section of the substrate where arsenic ions are implanted into each electrode, a contact layer, a source and a drain in the manufacturing process according to the third embodiment.
Figure 16:
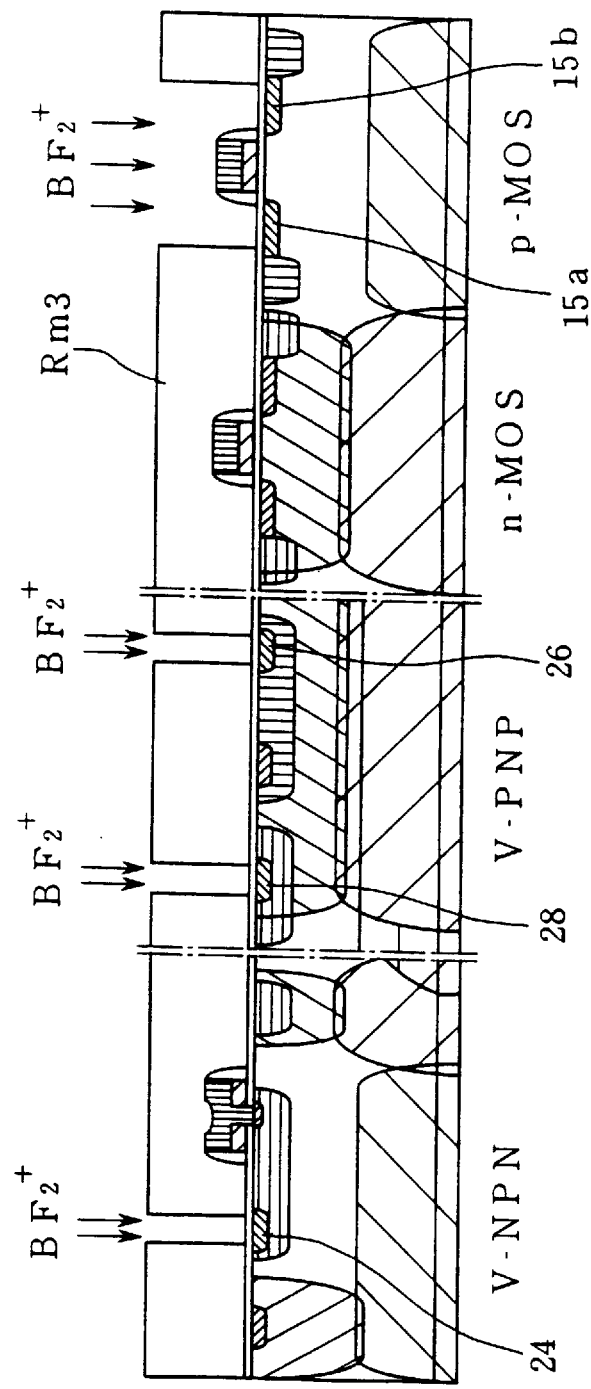
FIG. 16 is a section of the substrate where boron fluoride ions are implanted into each electrode, the contact layer, and a source—drain region in the manufacturing process according to the third embodiment.

A third embodiment will be described below. FIGS. 14 to 16 show a part of a manufacturing process of a semiconductor device according to the third embodiment.

FIG. 14 shows the step corresponding to the step shown in FIG. 9 according to the second embodiment. Almost the same steps as in FIGS. 1 to 3 according to the first embodiment are conducted prior to the step shown in FIG. 14. More specifically, an N$^-$ type buried layer 2, a collector buried layer 3a, an N$^+$ type buried layer 3b, P$^+$ type buried layers 4a and 4b, a P$^+$ type spare isolation region 5, an N$^-$ type epitaxial layer 6, P$^-$ type diffusion layers 7a and 7b, a PN isolation region 8, an N$^+$ type diffusion layer 9, an N$^-$ type channel stopper 10, a P$^-$ type active base layer 11, an N$^-$ type active base layer 12, a P$^-$ type channel stopper 13a, a P$^-$ type isolating diffusion layer 13b, and a P$^-$ type diffusion layer 16 are formed on a P type (111) silicon substrate 1. In the present embodiment, N$^-$ diffusion layers 14a and 14b and P$^-$ diffusion layers 15a and 15b to be sources and drains of a MOS transistor are not formed. Next, the dry-oxidization described with reference to FIG. 3 is conducted to form a silicon oxide film 17 of about 18 nm thickness. Then, the step shown in FIG. 8 according to the second embodiment is performed to form a polysilicon film 18B which serves as a protection film on the silicon oxide film 17. Immediately after the silicon oxide film 17 is formed, a polysilicon film 18B of about 100 nm thickness is formed as a protection film on the silicon oxide film 17 according to a low pressure CVD method. Then, arsenic (As$^+$) ions are implanted into the polysilicon film 18B which serves as the protection film under conditions of 60 keV and $1 \times 10^{16}$ cm$^{-2}$ so that the polysilicon film 18B is changed to have an N$^+$ type.

Next, as shown in FIG. 14, dry-etching is conducted by using a resist film as a mask to selectively remove the polysilicon film 18B and the silicon oxide film 17. Thus, a contact hole 19a for an emitter layer of a vertical NPN transistor is formed.

Next, as shown in FIG. 15, a polysilicon film 2 of about 300 nm thickness is formed so as to cover the contact hole 19a and the polysilicon film 18B according to the low pressure CVD method. Then, a resist film is formed on the polysilicon film 21 so as to cover a region where an emitter electrode of the vertical NPN transistor is to be formed and a region where a gate electrode of a MOS transistor is to be formed in the same manner as the step shown in FIG. 10 according to the first embodiment (this step is not shown). Thereafter, the polysilicon films 18B and 21 are patterned according to a dry-etching method to form a polysilicon emitter electrode 50a of the vertical NPN transistor and a polysilicon gate electrode 50b of NMOS and PMOS transistors. Also in the present embodiment, a base electrode, a collector electrode, a source electrode and a drain electrode which are made of a polysilicon film are not formed unlike the first embodiment. Then, a HTO film is laid over the whole face according to the low pressure CVD method and the whole face is then etched according to an anisotropic dry-etching method to remove the HTO film provided on portions other than the sides of the emitter electrode 50a of the vertical NPN transistor and the gate electrode 50b of N$^-$ and P$^-$channel type MOS transistors. Thus, a side wall 41 made of the HTO film is formed on both sides of the emitter electrode 50a and the gate electrode 50b.

Next, as shown in FIG. 15, a resist film Rm2 is formed in the same manner as in FIG. 11 according to the second embodiment. Arsenic (As$^+$) ions are implanted into the polysilicon film 21 and the silicon under conditions of 60 keV and $1\times10^{16}$ cm$^{-2}$ by using the resist film Rm2, the gate electrode 50a and the side wall 41 as masks. Thereafter, heat treatment at 950° C. is conducted for 60 minutes so as to diffuse the arsenic in the silicon to form an N$^+$ base contact portion 27 of the vertical PNP transistor, an N$^+$ collector contact portion 25 of the vertical NPN transistor, and an N$^+$ source 14a (which also serves as a contact layer) and an N$^+$ drain 14b (which also serves as the contact layer) of the N-channel type MOS transistor. In addition, the arsenic is diffused from the polysilicon films 18B and 21 into the silicon to form an N$^+$ emitter layer 23 of the vertical NPN transistor.

Further, as shown in FIG. 16, a resist film Rm3 is formed in the same manner as in FIG. 12 according to the second embodiment. Boron fluoride (BF2$^+$) ions are implanted into the polysilicon film 21 and the silicon under conditions of 30 keV and $5\times10^{15}$ cm$^{-2}$ by using the resist film Rm3, the gate electrode 50b and the side wall 41 as masks. Thereafter, heat treatment at 900° C. is conducted for 60 minutes so as to diffuse boron in the polysilicon film 21 and the silicon to form a P$^+$ base contact portion 24 of the vertical NPN transistor, a P$^+$ collector contact portion 28 of the vertical PNP transistor, a P$^+$ emitter layer 26 of the vertical PNP transistor, and a P$^+$ source 15a (which also serves as a contact layer) and a P$^+$ drain 15b (which also serves as the contact layer) of the P-channel type MOS transistor which are arranged in self-alignment with the side wall 41.

Figure 17:
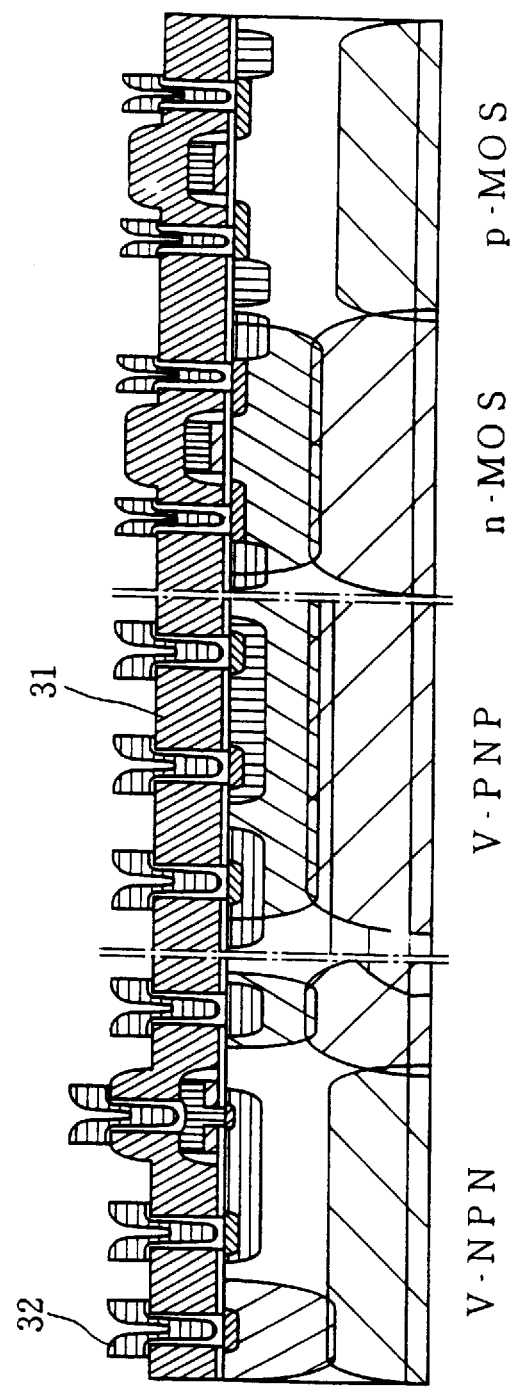
FIG. 17 is a section of the substrate on which an Al wiring is formed in the manufacturing process according to the third embodiment.

Next, as shown in FIG. 17, an NSG film 31 and an Al wiring 32 are formed in the same manner as in the second embodiment (see the description of FIG. 13).

According to the present embodiment, only the time of the steps to form the N$^+$ sources 14a and 15a and N$^+$ drains 14b and 15b of the MOS transistor is different from that in the second embodiment. Consequently, the present embodiment has the same effects as those of the second embodiment.

As the peculiar effects of the present embodiment, the side wall 41 is formed on both sides of the gate electrode 50b of the MOS transistor and the sources and drains 14a, 15a and 14b, 15b of the MOS transistor are formed in self-alignment with the side wall 41. Therefore, it is possible to manufacture a minuter transistor than in the second embodiment. Accordingly, a MOS transistor having the higher performance, higher speed and higher density can be manufactured without an increase in the number of masks and steps required for the manufacturing process of a bipolar transistor.

At the stage in which the gate electrode is formed in the MOS transistor, impurity ions having a low concentration are implanted by using the gate electrode as a mask and impurity ions having a high concentration are then implanted by using the gate electrode and the side wall as masks in the same manner as in the present embodiment. Thus, it is also possible to manufacture a MOS transistor having so-called LDD structure which is more suitable for miniaturization.

(FOURTH EMBODIMENT)

A fourth embodiment will be described below.

Figure 18:
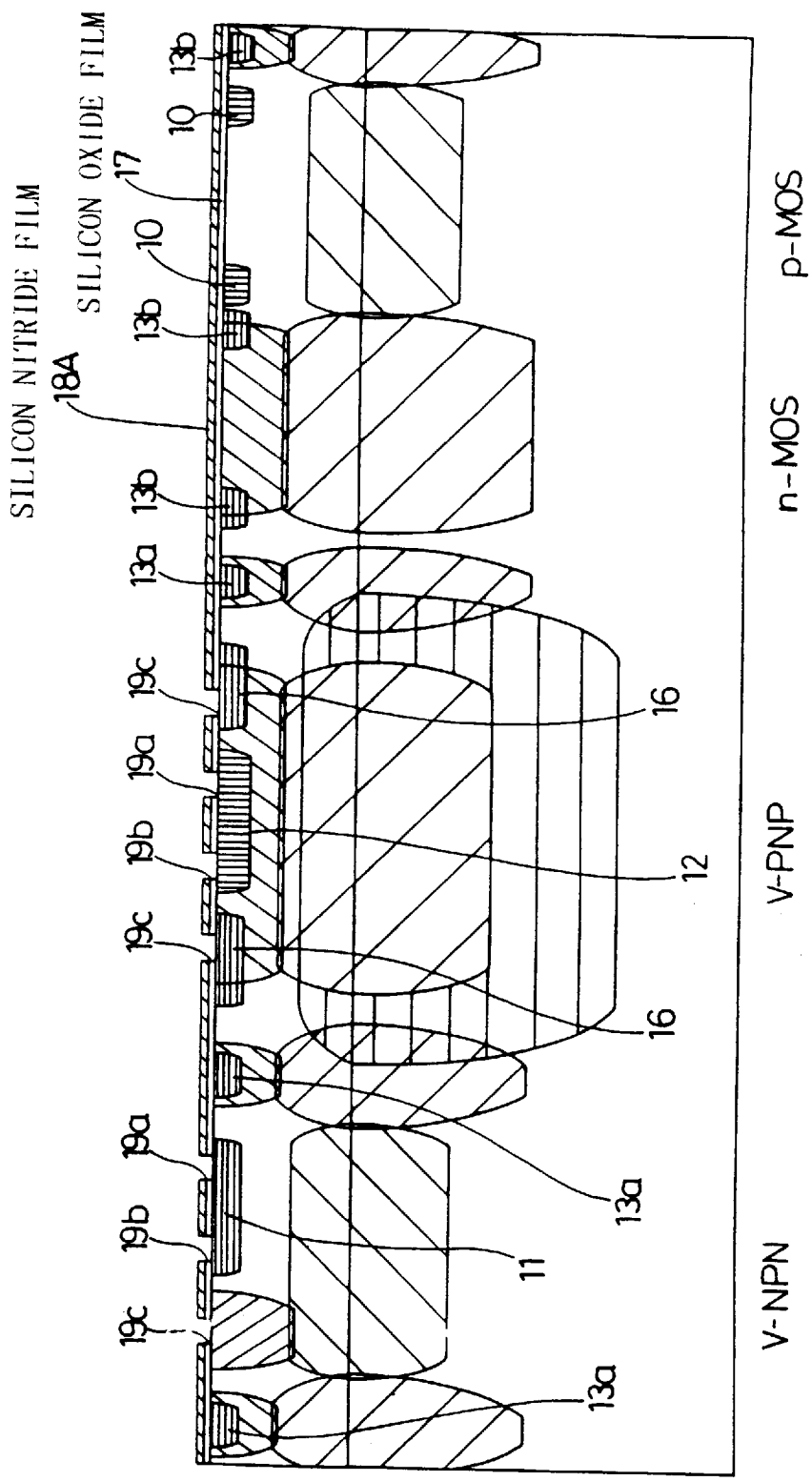
FIG. 18 is a section of a substrate on which a silicon oxide film and a silicon nitride film are formed and a contact hole is formed in a manufacturing process according to a fourth embodiment.
Figure 19:
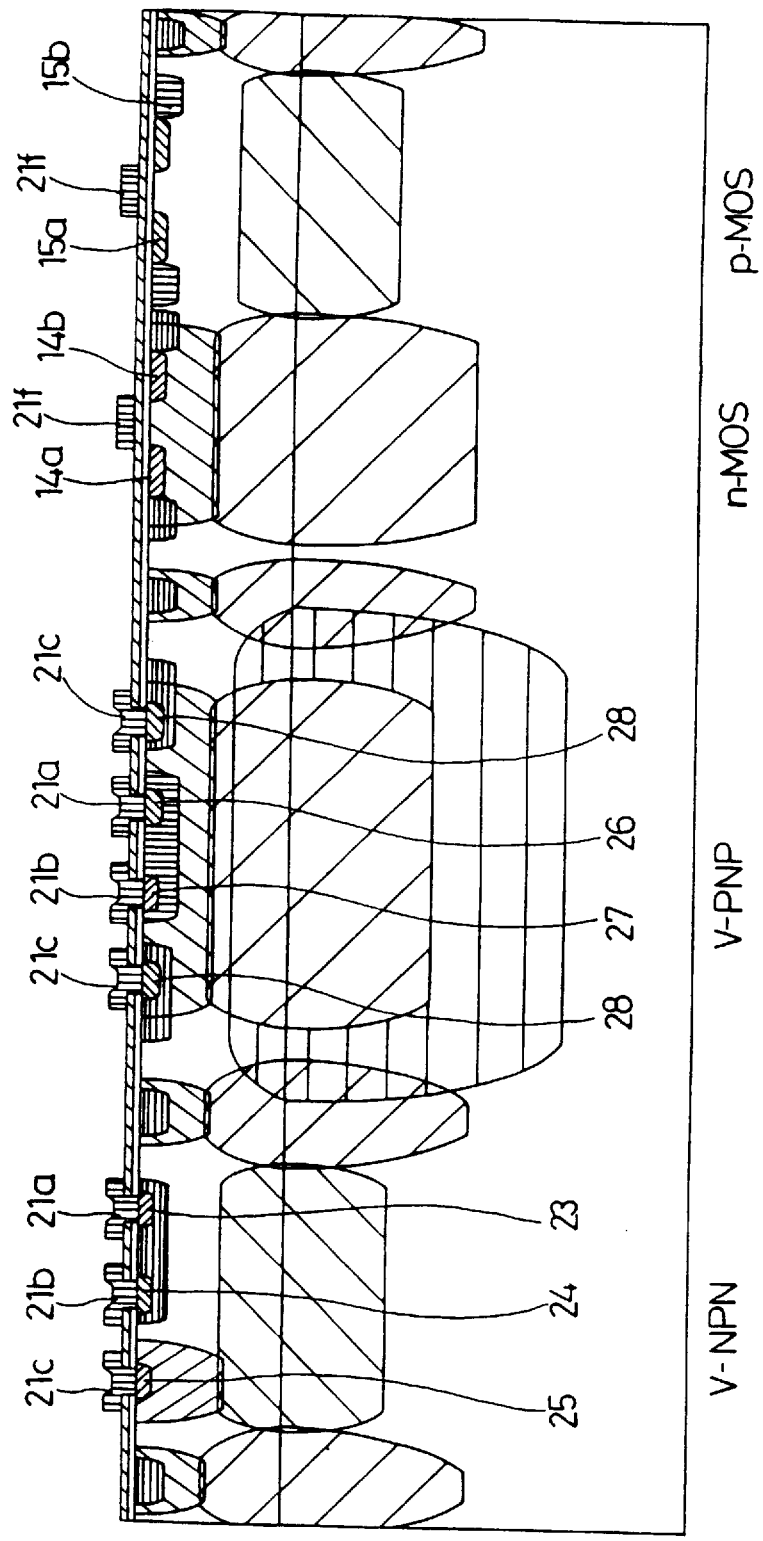
FIG. 19 is a section of the substrate on which a polysilicon electrode and an active region are formed in the manufacturing process according to the fourth embodiment.
Figure 20:
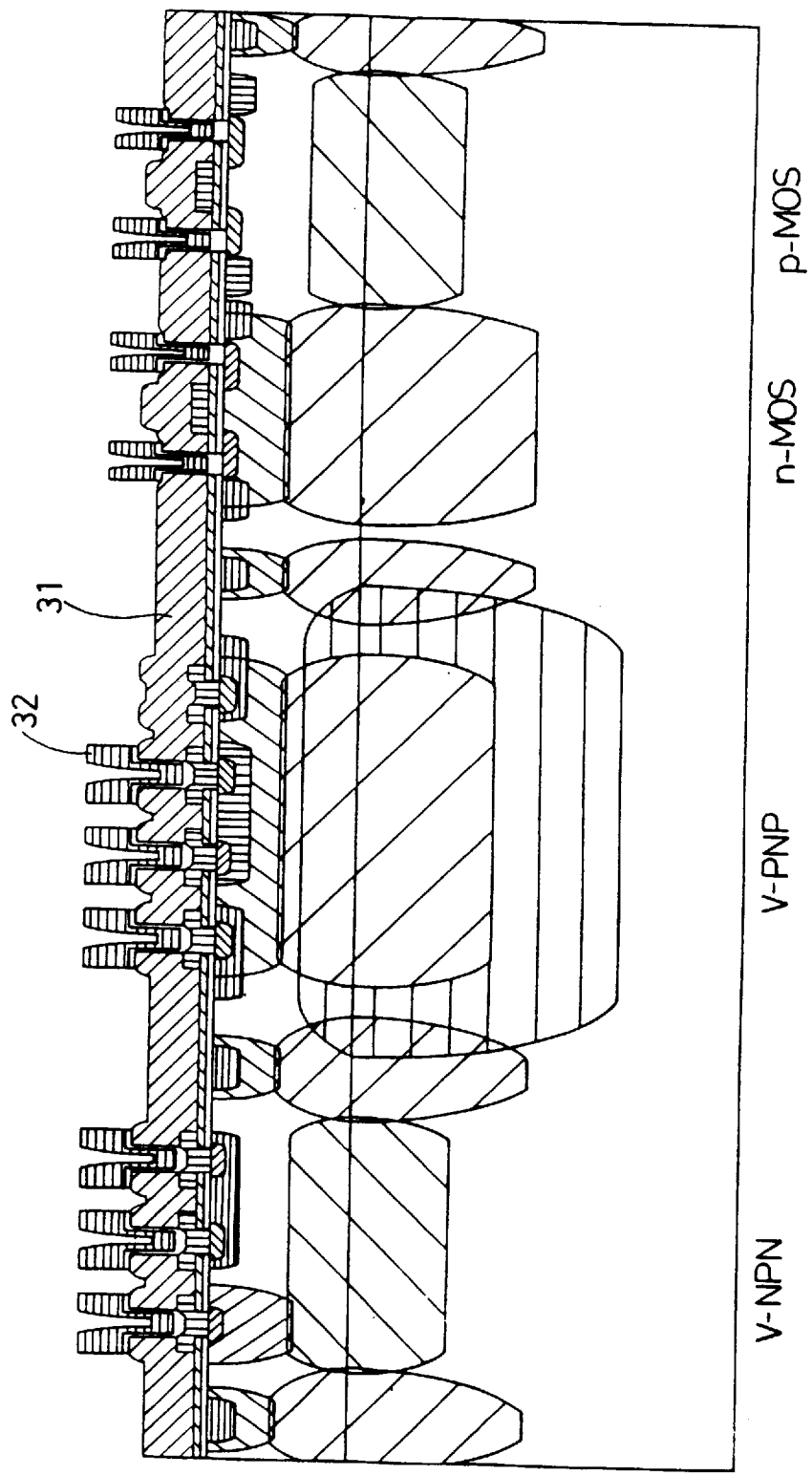
FIG. 20 is a section of the substrate on which an Al wiring is formed in the manufacturing process according to the fourth embodiment.

FIGS. 18 to 20 show a manufacturing process of a semiconductor device according to the fourth embodiment. The same steps as those shown in FIGS. 1 to 3 according to the first embodiment are conducted prior to the step shown in FIG. 18. More specifically, the same step as shown in FIG. 1 is conducted to form, on a P type (111) silicon substrate 1, an N$^-$ type buried layer 2, a collector buried layer 3a, an N$^+$ type buried layer 3b, P$^+$ type buried layers 4a and 4b, a P$^+$ type spare isolation region 5, an N$^-$ type epitaxial layer 6, P$^-$ type diffusion layers 7a and 7b, a PN isolation region 8, an N$^+$ type diffusion layer 9, an N$^-$ type channel stopper 10, a P$^-$ type active base layer 11, an N$^-$ type active base layer 12, a P$^-$ type channel stopper 13a, a P$^-$ type isolating diffusion layer 13b, and a P$^-$ type diffusion layer 16. Wherein, neither of N$^-$ diffusion layers 14a, 14b nor P$^-$ diffusion layers 15a, 15b which are to be sources and drains of the MOS transistor is formed in this embodiment. Then the silicon oxide film 17 of 5 nm thickness is formed thereon by the same dry-oxidization as in FIG. 3.

As shown in FIG. 18, the silicon nitride film 18A of 20 nm thickness is formed thereon as the protection film by the low pressure CVD method. Then using the resist as a mask, the silicon nitride film 18A and the silicon oxide film 17 are selectively dry-etched to form each contact hole 19a–19c of the vertical NPN transistor and the vertical PNP transistor.

Next, as shown in FIG. 19, the polysilicon film 21 of 300 nm thickness is formed on the substrate according to the low pressure CVD method and is selectively dry-etched using the resist as a mask to form each electrode 21a–21c of the vertical NPN transistor and the vertical PNP transistor and the gate electrodes 21f of the N-channel type MOS transistor and the P-channel type MOS transistor. The arsenic ions are implanted into the polysilicon film 21 and the silicon, being self-aligned, using the resist and the gate electrodes 21f of the MOS transistors as a mask, under conditions of 60 keV and $1\times10^{16}$ cm$^2$, then the heat treatment at 950° C. is conducted for 60 minutes, so that the arsenic ions are diffused in the silicon and from the polysilicon film 21 to the silicon to form an N$^+$ base contact 27 of the vertical PNP transistor, an N$^+$ collector contact 25 and an N$^+$ emitter layer 23 of the vertical NPN transistor, and an N$^+$ source 14a (serving also as a contact layer) and an N$^+$ drain 14b (serving also as a contact layer) of the N-channel type MOS transistor. Further, the boron ions are implanted into the polysilicon film 21 and the silicon, being self-aligned, using the resist and the gate electrodes 21f of the MOS transistors as a mask, under conditions of 30 keV and $5\times10^{15}$ cm$^{-2}$, and the heat treatment at 900° C. is conducted for 60 minutes so that the boron ions are diffused in the silicon and from the polysilicon film 21 to the silicon to form a P$^+$ base contact 24 of the vertical NPN transistor, a P$^+$ collector contact 28 and a P$^+$ emitter layer 26 of the vertical PNP transistor, and a P$^+$ source 15a (serving also as a contact layer) and P$^+$ drain 15b (serving also as a contact layer) of the P-channel type MOS transistor.

Then, as shown in FIG. 20, the NSG film 31 and the Al wiring 32 are formed as well as in the first embodiment (see FIG. 17).

In the fourth embodiment, the manufacturing process of the bipolar transistor is the same as that in the first embodiment. As the source and drain regions of the MOS transistors are formed being self-aligned with the gate electrodes, the MOS transistor more suitable for microfabrication is formed.

In addition, the silicon oxide film 17 and the gate nitride film 18A of the MOS transistors are so thin (5 nm and 20 nm respectively) that the MOS transistors can be used as an MNOS type non volatile memory. In consequence, the MNOS type non volatile memory is manufactured at the same time without increase in the numbers of masks and manufacturing steps for the bipolar transistor.

(FIFTH EMBODIMENT)

Figure 21:
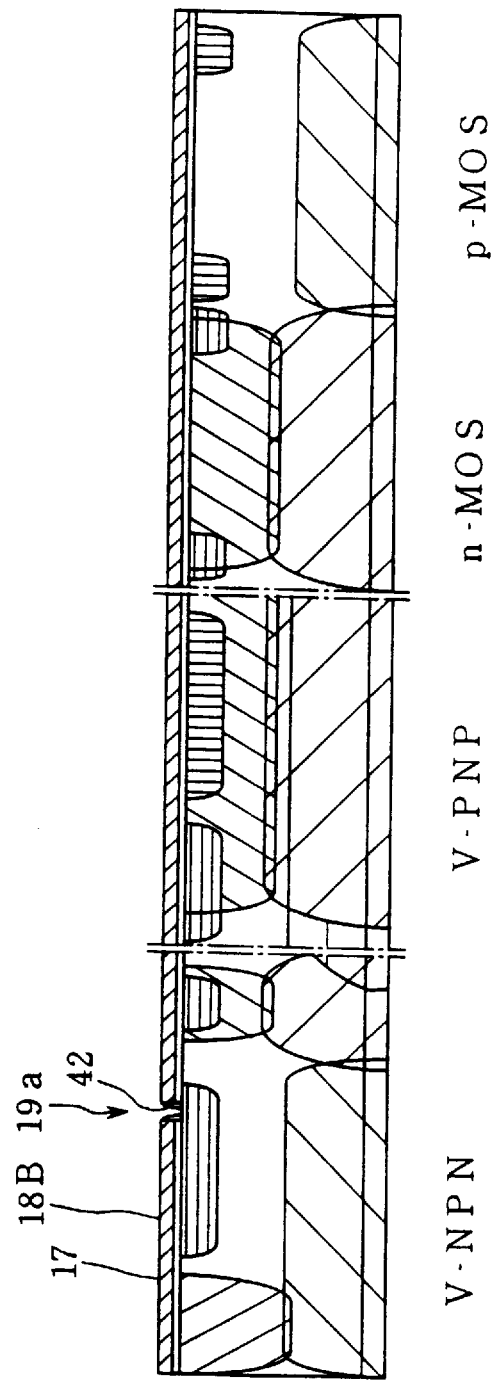
FIG. 21 is a section of a substrate where a silicon oxide film and a polysilicon nitride film are formed and a contact hole and a side wall are formed in a manufacturing process according to a fifth embodiment.
Figure 22:
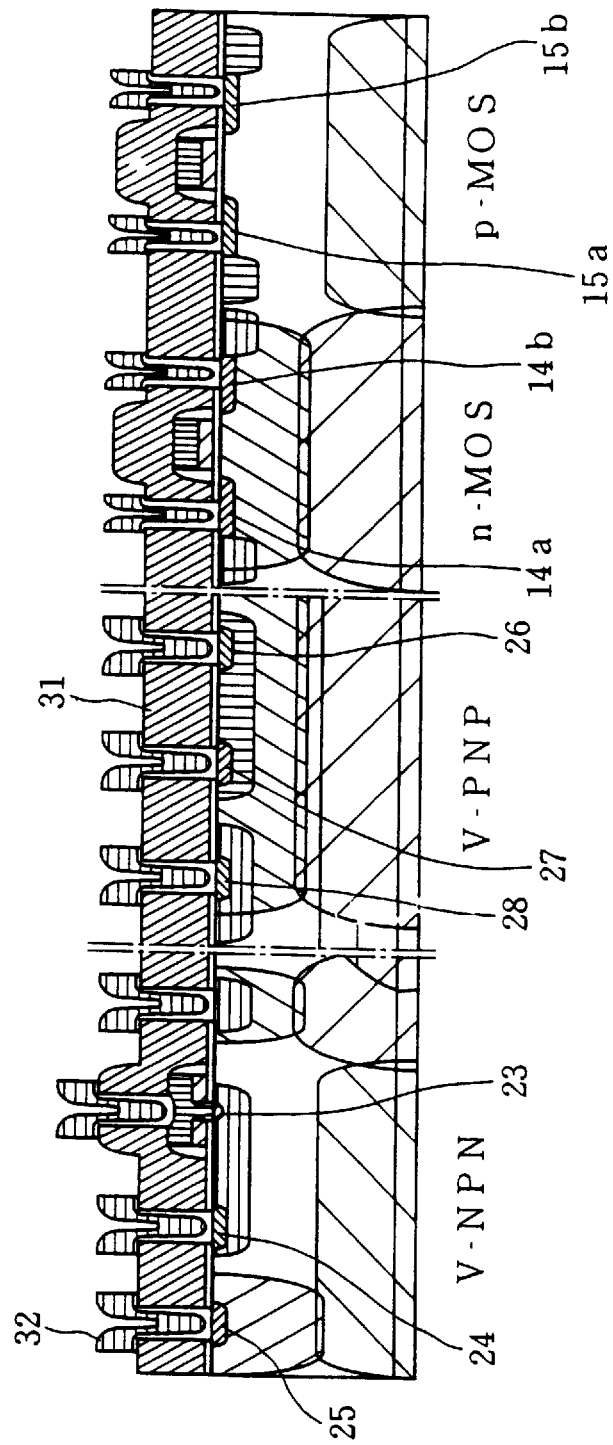
FIG. 22 is a section of the substrate on which an Al wiring is formed in the manufacturing process according to the fifth embodiment.

A fifth embodiment will be described below. FIGS. 21 and 22 show a manufacturing process of a semiconductor device according to the fifth embodiment. The manufacturing process according to the present embodiment is the same as in the second embodiment except that a side wall is formed on a contact hole of an emitter layer of a vertical NPN transistor and a source-drain is formed in self-alignment with a gate electrode. For this reason, only characteristic steps are shown in the drawings.

FIG. 21 shows the step corresponding to the step shown in FIG. 9 according to the second embodiment. More specifically, the step shown in FIG. 21 is conducted after the steps shown in FIGS. 1 to 3 according to the first embodiment and the step shown in FIG. 8 according to the second embodiment. In the present embodiment, $N^-$ diffusion layers 14a and 14b and $P^-$ diffusion layers 15a and 15b to be sources and drains of a MOS transistor have not been formed before this step.

At the step shown in FIG. 21 according to the present embodiment, a silicon oxide film 17 and a polysilicon film 18B are patterned to form a contact hole 19a in a region where an emitter layer of an NPN transistor is to be formed. Then, a HTO film is laid over the whole face according to a low pressure CVD method and the whole face is etched according to an anisotropic dry-etching method to remove the HTO film provided on portions other than the sides of the contact hole 19a. Thus, a side wall 42 made of the HTO film is formed on the sides of the contact hole 19a.

Subsequently, the step shown in FIG. 22 is conducted after the steps shown in FIGS. 10 to 12 according to the second embodiment.

In other words, the same step as that of FIG. 10 is conducted to form an emitter electrode 50a of the vertical NPN transistor and a gate electrode 50b of each MOS transistor.

In the same manner as the step shown in FIG. 11, arsenic ions are implanted and diffused to form an $N^+$ base contact portion 27 of the vertical PNP transistor, an $N^+$ collector contact portion 25 of the vertical NPN transistor, and an $N^+$ source 14a (which also serves as a contact layer) and an $N^+$ drain 14b (which also serves as the contact layer) of the N-channel type MOS transistor. Arsenic is diffused from the polysilicon films 18B and 21 into the silicon to form an $N^+$ emitter layer 23 of the vertical NPN transistor. In this case, the side wall 42 is formed on the sides of the contact hole 19a on the $N^+$ emitter layer 23 in the present embodiment. Consequently, the contact hole 19a becomes narrower so that a very small $N^+$ emitter layer 23 is formed.

In the same manner as the step shown in FIG. 12, boron ions are implanted and diffused to form a $P^+$ base contact portion 24 of the vertical NPN transistor, a $P^+$ collector contact portion 28 of the vertical PNP transistor, a $P^+$ emitter layer 26 of the vertical PNP transistor, and a $P^+$ source 15a (which also serves as a contact layer) and a $P^+$ drain 15b (which also serves as the contact layer) of the P-channel type MOS transistor.

Next, as shown in FIG. 22, an NSG film 31 and an Al wiring 32 are formed in the same manner as in the second embodiment.

In the present embodiment described above, the sources and drains 14a, 15a and 14b, 15b of the MOS transistor are formed in self-alignment with the gate electrode 50b in addition to the effects of the second embodiment. Consequently, it is possible to manufacture a minuter MOS transistor.

Figure 27:
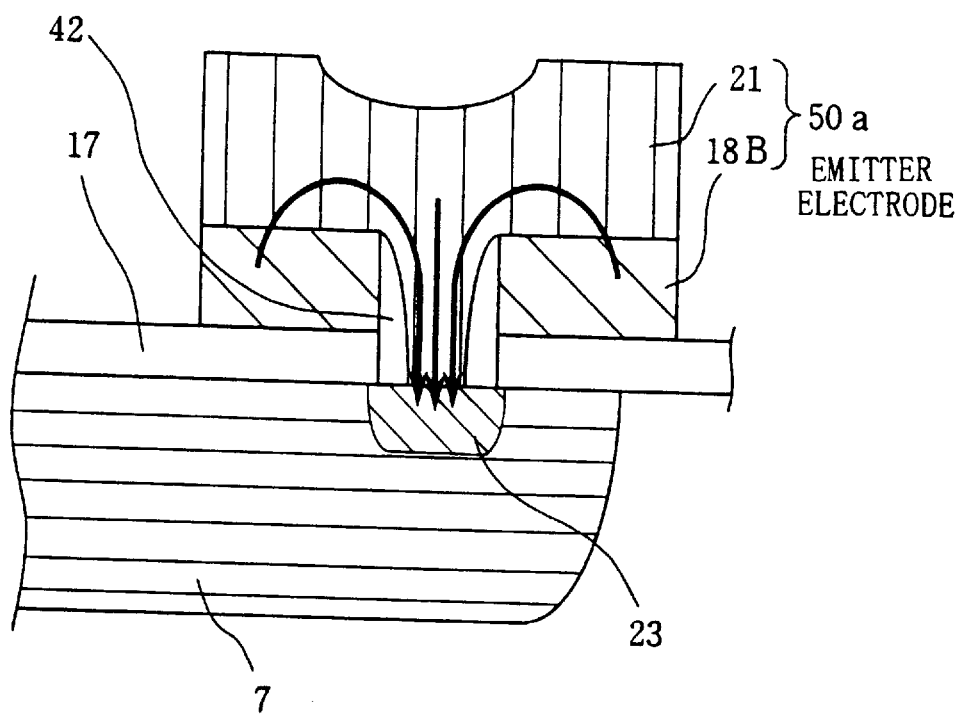
FIG. 27 is a section of a diffusion path of arsenic from an emitter electrode to an emitter layer formed in the manufacturing process according to the fifth embodiment.

As the peculiar effects of the present embodiment, the side wall 42 is formed on the sides of the contact hole 19a on the $N^+$ emitter layer 23 of the vertical NPN bipolar transistor and the polysilicon film 21 forming the emitter electrode 50a is then laid. Consequently, the contact area of the emitter electrode 50a with the silicon substrate 1 becomes very small. In the present embodiment, the arsenic is diffused from the polysilicon films 18B and 21 through two paths as shown in FIG. 27. Accordingly, it is possible to realize an emitter width which is smaller than an emitter width defined by photolithography when forming the $N^+$ emitter layer 23 unlike the second embodiment. Thus, a parasitic amount between an emitter and a base can be reduced. Consequently, it is possible to manufacture a vertical NPN bipolar transistor having the higher performance, higher speed and lower consumed power concurrently with the manufacture of the MOS transistor without an increase in the number of masks required for the manufacturing process of the bipolar transistor.

(SIXTH EMBODIMENT)

A sixth embodiment will be described below.

Figure 23:
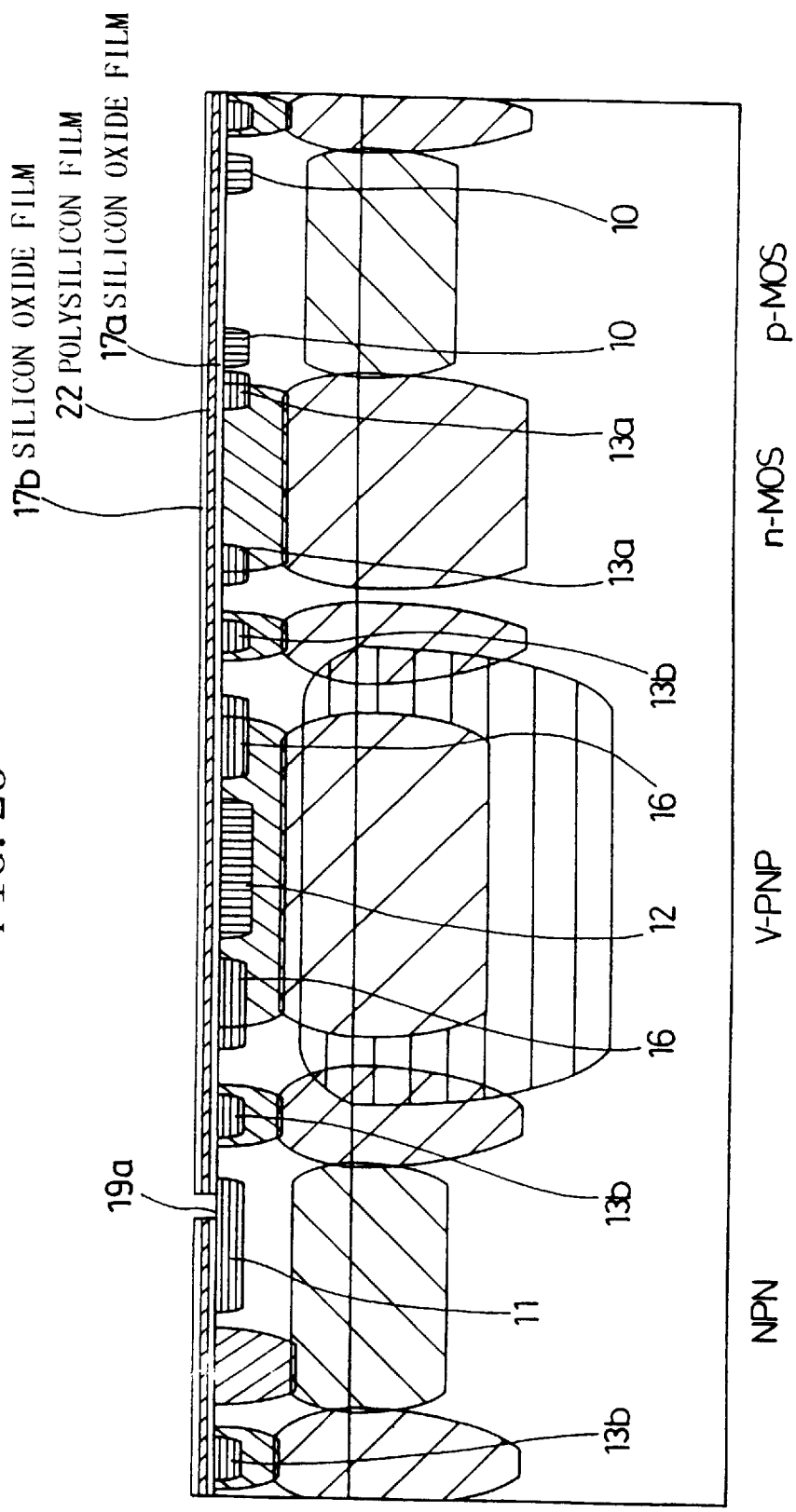
FIG. 23 is a section of a substrate where two silicon oxide films and a polysilicon film therebetween are formed and a contact hole is formed in a manufacturing process according to a sixth embodiment.
Figure 24:
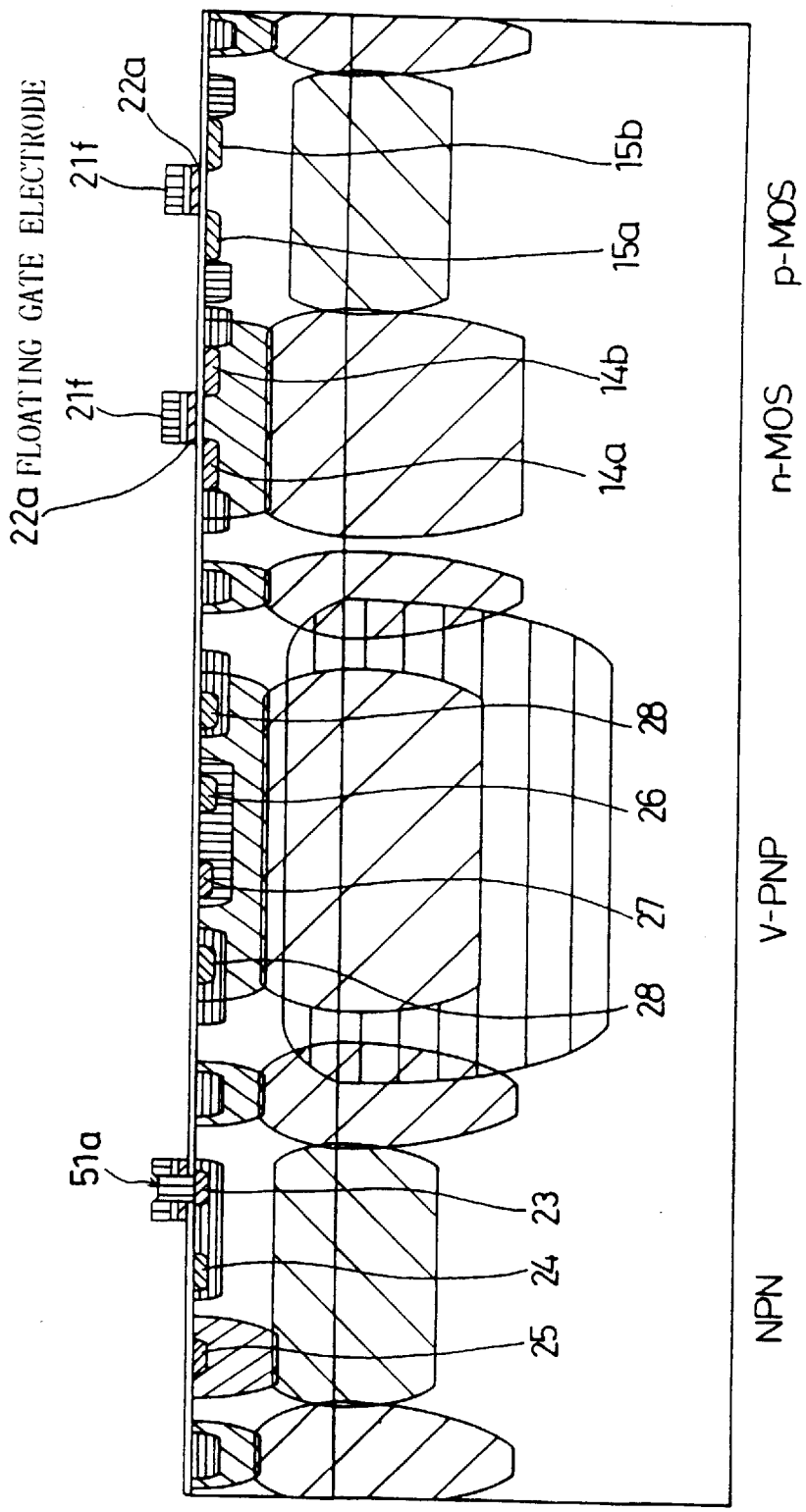
FIG. 24 is a section of the substrate on which an emitter electrode and a floating gate electrode are formed in the manufacturing process according to the sixth embodiment.
Figure 25:
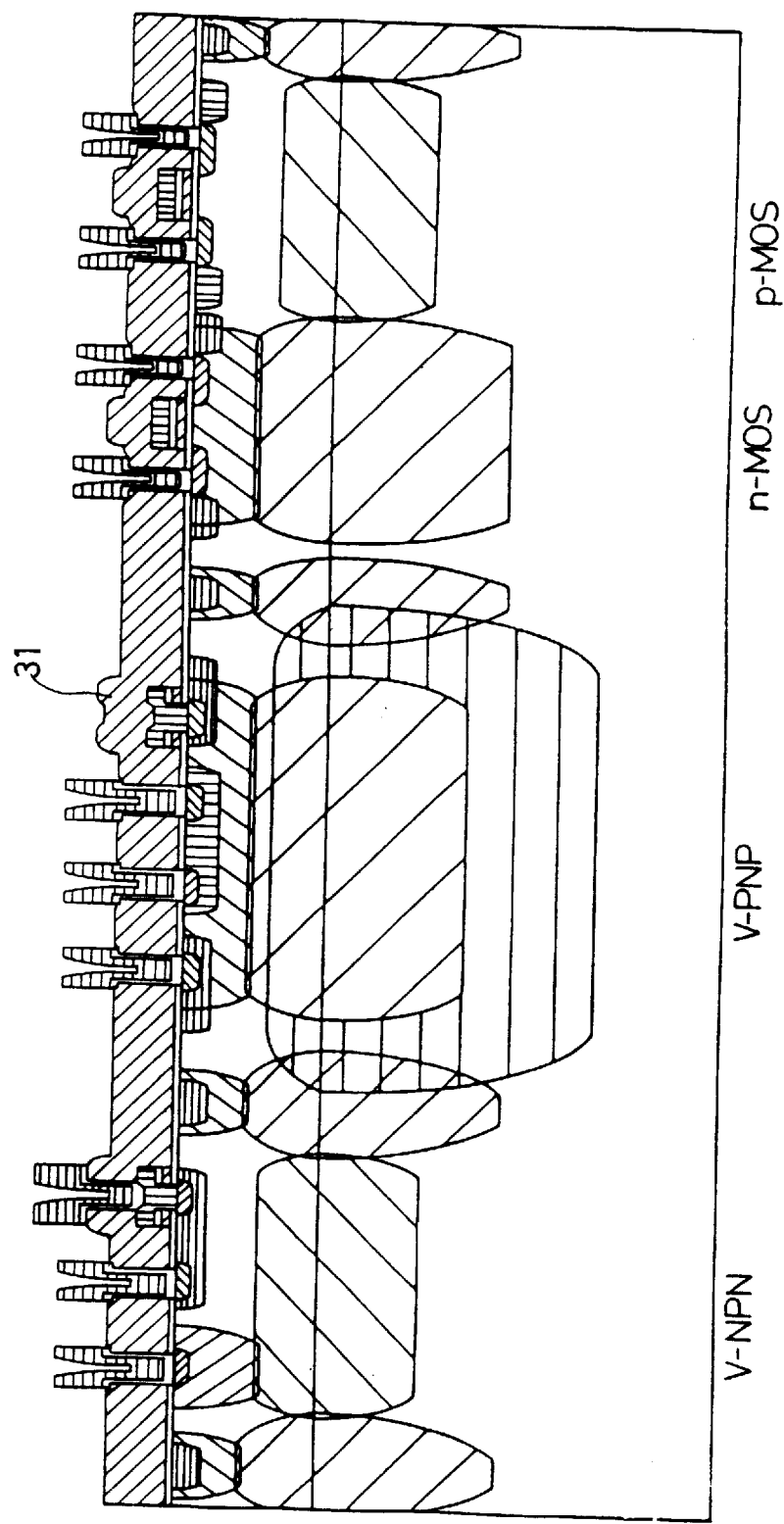
FIG. 25 is a section of the substrate on which an Al wiring is formed in the manufacturing process according to the sixth embodiment.

FIGS. 23 to 25 show a manufacturing process of a semiconductor device according to the sixth embodiment. The step shown in FIG. 20 is conducted after the steps shown in FIGS. 1 to 3 according to the first embodiment.

After an $N^+$ type diffusion layer 9 to be a collector wall region of a vertical NPN transistor shown in FIG. 2 is formed, boron ions are implanted and heat treatment is conducted in the same manner as in the description of FIG. 3 to form a $P^-$ type active base layer 11, a $P^-$ type diffusion layer 16, a $P^-$ type channel stopper 13a and a $P^-$ type isolating diffusion layer 13b. Then, phosphorus ions are implanted in the same manner as in the description of FIG. 3 to form an $N^-$ type active base layer 12 and an $N^-$ type channel stopper 10. $N^-$ diffusion layers 14a and 14b and $P^-$ diffusion layers 15a and 15b to be sources and drains of a MOS transistor are not formed. The dry-oxidization is carried out in the same manner as in the description of FIG. 3 to form a silicon oxide film 17a of about 18 nm thickness.

Next, immediately after the silicon oxide film 17a is formed, a thick polysilicon film 22 of, for example, about 50 nm thickness serving as a protection film and to be a floating gate electrode is laid on the silicon oxide film 17a according to a low pressure CVD method as shown in FIG. 23. Then, the dry-oxidization at 900° C. is conducted for 30 minutes, a silicon oxide film 17b for insulating a gate electrode from the floating gate electrode is formed in a thickness of about 10 nm on the polysilicon film 22, and arsenic ions are implanted into the whole face of the polysilicon film 22 under conditions of 60 keV and $1 \times 10^{16}$ $cm^{-2}$ for making the polysilicon film 22 a floating gate electrode.

Next, by using a resist film as a mask, the polysilicon film 22 and the silicon oxide films 17a and 17b in a region where an emitter of a vertical NPN transistor is to be formed are selectively dry-etched to form a contact hole 19a for the emitter diffusion layer and the polysilicon emitter electrode of the vertical NPN transistor.

Then, as shown in FIG. 24, a polysilicon film 21 of about 300 nm thickness is formed on the substrate according to the low pressure CVD method and dry-etched by using a resist film as a mask to selectively remove the silicon oxide film 17a and the polysilicon films 21 and 22. Thus, an emitter electrode 51a of the vertical NPN transistor which is made of the polysilicon films 21 and 22 and a gate electrode 21f of $N^-$ and P-channel type MOS transistors are formed. At this time, a floating gate electrode 22a made of the polysilicon film 22 is formed in each MOS transistor.

Next, arsenic ions are implanted into the polysilicon film 21 and the silicon under conditions of 60 keV and $1 \times 10^{16}$ $cm^{-2}$ by using the resist film and the gate electrode 21f of the MOS transistor as masks. Thereafter, heat treatment at 950° C. is conducted for 60 minutes to diffuse arsenic in the silicon to form an $N^+$ base contact portion 27 of the vertical PNP transistor, an $N^+$ collector contact portion 25 of the vertical NPN transistor, and an $N^+$ source 14a (which also serves as a contact layer) and an $N^+$ drain 14b (which also serves as the contact layer) of the N-channel type MOS transistor. In addition, the arsenic is diffused from the polysilicon films 22 and 21 into the silicon to form an $N^+$ emitter layer 23 of the vertical NPN transistor. Furthermore, boron ions are implanted into the polysilicon film 21 and the silicon under conditions of 30 keV and $5 \times 10^{15}$ $cm^{-2}$ by using the resist film and the gate electrode 21f of the MOS transistor as masks. Thereafter, heat treatment at 900° C. is conducted for 60 minutes to diffuse the boron in the polysilicon film 21 and the silicon to form a $P^+$ base contact portion 24 of the vertical NPN transistor, a $P^+$ collector contact portion 28 of the vertical PNP transistor, a $P^+$ emitter layer 26 of the vertical PNP transistor, and a $P^+$ source 15a (which also serves as a contact layer) and a $P^+$ drain 15b (which also serves as the contact layer) of the P-channel type MOS transistor.

Next, as shown in FIG. 25, an NSG film 31 and an Al wiring 32 are formed in the same manner as in the second embodiment (see the description of FIG. 13).

Figure 28:
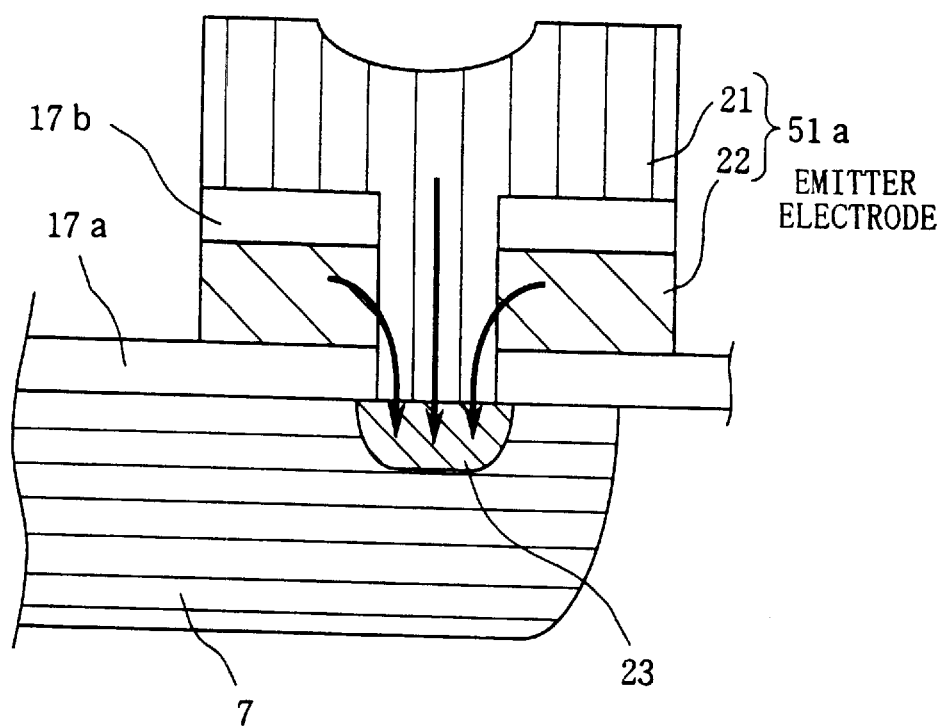
FIG. 28 is a section of a diffusion path of arsenic from an emitter electrode to an emitter layer formed in the manufacturing process according to the sixth embodiment.

According to the present embodiment described above, the MOS transistor is exchanged for a FAMOS transistor and the isolating insulator film of the base diffusion layer and the emitter electrode of the bipolar transistor has different structure as compared with the third embodiment. However, the basic structure is not changed. Therefore, the present embodiment has all the effects of the third embodiment. As shown in FIG. 28, the arsenic is diffused from the polysilicon films 21 and 22 into the silicon substrate 1 through two paths when forming the $N^+$ emitter layer 23 of the NPN transistor.

As the peculiar effects of the present embodiment, the silicon oxide film 17a is formed as a dielectric film, the polysilicon film 22 for the floating gate electrode is formed as a protection film on the silicon oxide film 17a, the silicon oxide film 17b for insulating the floating gate electrode from the gate electrode is formed on the polysilicon film 22, and the contact hole 19a for the polysilicon emitter electrode of the vertical NPN bipolar transistor is formed in the same manner as in the third embodiment. Consequently, it is possible to manufacture the bipolar transistor and the FAMOS transistor as a non-volatile memory concurrently with each other without an increase in the number of the masks and the steps required for the manufacturing process of the bipolar transistor.

As compared with the third embodiment, the isolating insulator film of the base diffusion layer and the emitter electrode of the bipolar transistor has different structure and the effective thickness of the insulator film is increased. Consequently, the parasitic amount between an emitter and a base can be reduced. Thus, it is possible to manufacture a bipolar transistor having the higher performance, higher speed and lower consumed power.

(OTHER EMBODIMENTS)

Other embodiments according to variants of the above-mentioned embodiments will be described below.

In the first and fourth embodiments, with the silicon nitride film 18A as the protection film, the gate insulator film is a two-layer ON film made of the silicon oxide film 17 and the silicon nitride film 18A, that is, an ON film. The protection film may be the two-layer film made of the silicon nitride film and the silicon oxide film so that the gate insulator film is a three-layer film (ONO film).

In the second, third, fifth and sixth embodiments, similarly, the gate insulator film is a single-layer film made of the silicon oxide film 17. The gate insulator film may be a multiple-layer film such as the ON film or the ONO film.

In the first to sixth embodiments, the gate insulator film necessarily includes the silicon oxide film (silicon oxide films 17, 17a, 17b). The silicon oxide film may be exchanged for the silicon nitride film.

Further, a silicide film such as TiSi2, MoSi2 or CoSi2 may be used as the protection film or dielectric film.

In the first to sixth embodiments, before the silicon oxide film 17 is formed, the $P^-$ type active base layer 11 to be the base region of the vertical NPN transistor, the $P^-$ type diffusion layer 16 to be the collector wall region of the vertical PNP transistor, the $P^-$ type channel stopper 13a to be the channel stopper of the N-channel type MOS transistor, the $P^-$ type isolating diffusion layer 13b to be a part of the element isolating region, the $N^-$ type active base layer 12 to be the base region of the vertical PNP transistor, the $N^-$ type channel stopper 10 to be the channel stopper of the $P^-$ channel type MOS transistor, and the like are formed. However, the order of the steps is not limited to each embodiment. They may be formed after the silicon oxide film 17 (17a) and the silicon nitride film 18A to be the gate insulator film are formed, or they may be formed by utilizing the diffusions from the electrode and in a part of the silicon subsurface substrate after the electrode is formed.

In the second to sixth embodiments, source and drain regions are formed to have single structure with the gate electrode or side wall used as a self alignment mask. It is apparent that the source and drain regions may have LDD structure, DDD structure, or the like. In this case, it is possible to form the low concentration region of the source and drain of the MOS transistor concurrently with the formation of the $P^-$ active base region and the $N^-$ active base region of the bipolar transistor.

In the sixth embodiment, the bipolar transistor and the FAMOS transistor are manufactured at the same time, and an ordinary MOS transistor is not manufactured. However, it is also possible to manufacture the ordinary MOS transistor concurrently only by performing etching to remove the silicon oxide film 17b in a region where the ordinary MOS transistor is to be formed by using the resist film as a mask until the polysilicon emitter contact hole 19a of the vertical NPN bipolar transistor is formed after the silicon oxide film 17b for insulating the floating gate electrode from the gate electrode is formed in FIG. 23.

In the case where the side wall made of the dielectric film is formed on both sides of the emitter electrode as in the third embodiment, it is possible to dispose the base contact layer in the base diffusion region of the bipolar transistor in self-alignment with the side wall. At this time, the $P^+$ type impurity ions are implanted using the emitter polysilicon electrode and the side wall as a mask and a resist mask open to a region where the emitter diffusion layer of the PNP transistor and the base diffusion layer of the NPN transistor are to be formed, thereby the base contact layer is formed being self-aligned to the emitter electrode. Consequently, it is possible to manufacture a minuter semiconductor device.

We claim:

1. A semiconductor device in which a MIS transistor and a bipolar transistor are arranged on a semiconductor substrate, comprising:

a) the MIS transistor having:
   a gate insulator film formed on the semiconductor substrate;
   a gate electrode formed on the gate insulator film and made of first and second conductor films which are doped with a first conductivity type impurity; and
   a source-drain diffusion layer formed in regions placed on both sides of the gate electrode of the semiconductor substrate and into which the first conductivity type impurity is introduced; and b) the bipolar transistor having:
   an emitter diffusion layer, a base diffusion layer and a collector diffusion layer which are formed in the semiconductor substrate;
   an insulator film formed in a region of the semiconductor substrate where an emitter is to be formed, and made of the same material as that of the gate insulator film of the MIS transistor; and
   an emitter electrode formed on the insulator film and made of the same material as those of the first and second conductor films of the MIS transistor;

wherein the second conductor film of the emitter electrode buries a contact hole formed on the insulator film and the first conductor film to come in contact with the emitter diffusion layer; and the emitter diffusion layer is doped with the first conductivity type impurity diffused from the first and second conductor films forming the emitter electrode.

2. The semiconductor device according to claim 1, wherein the depth of the emitter diffusion layer of the bipolar transistor is smaller than that of the source-drain diffusion layer of the MIS transistor.

3. The semiconductor device according to claim 2, wherein the emitter diffusion layer of the bipolar transistor has a depth of 0.2 µm or less and a maximum impurity concentration of $8 \times 10^{19}$ cm$^{-3}$ or more; and the source-drain diffusion layer of the MIS transistor has a depth of 0.3 µm or less and a maximum impurity concentration of $1 \times 10^{20}$ cm$^{-3}$ or more.

4. The semiconductor device according to claim 1, wherein a first side wall made of an insulator material is provided on the outer side of the emitter electrode of the bipolar transistor; and a second side wall made of the same material as that of the first side wall is provided on the side of the gate electrode of the MIS transistor.

5. The semiconductor device according to claim 1, wherein a third side wall made of an insulator material is provided on the side of the contact hole of the emitter electrode of the bipolar transistor.

6. The semiconductor device according to claim 4, wherein a base contact layer formed in self-alignment with the first side wall is provided in the base diffusion layer of the bipolar transistor.

7. The semiconductor device according to claim 1, wherein an interelectrode insulator film is formed between the first and second conductor films of the gate electrode of the MIS transistor and the emitter electrode of the bipolar transistor;

the MIS transistor serves as a non-volatile memory cell transistor;

the first conductor film serves as a floating gate of the non-volatile memory cell; and the second conductor film serves as a control gate of the non-volatile memory cell.

8. The semiconductor device according to claim 1, wherein the bipolar transistor is an NPN type bipolar transistor; and the MIS transistor is an N-channel type MIS transistor.

* * * * *